United States Patent [19]

Kendall et al.

[11] 4,065,742
[45] Dec. 27, 1977

[54] COMPOSITE SEMICONDUCTOR STRUCTURES

[75] Inventors: Don Leslie Kendall, Richardson; Millard Monroe Judy, Dallas, both of Tex.

[73] Assignee: Texas Instruments Incorporated, Dallas, Tex.

[21] Appl. No.: 589,731

[22] Filed: June 23, 1975

Related U.S. Application Data

[62] Division of Ser. No. 276,808, July 31, 1972, abandoned.

[51] Int. Cl.² .................. H01C 7/06; H01L 27/02; H01L 29/06
[52] U.S. Cl. .......................................... 338/9; 338/7; 357/20; 357/51; 357/55; 357/56; 357/60; 357/76
[58] Field of Search .................. 357/51, 60, 20, 55, 357/56, 76; 338/7, 9, 204, 295

[56] References Cited

U.S. PATENT DOCUMENTS

| 2,841,508 | 7/1958 | Roup et al. | 357/14 |
| 3,015,762 | 1/1962 | Shockley | 357/76 |
| 3,171,068 | 2/1965 | Denkewalter et al. | 357/20 |
| 3,453,498 | 7/1969 | Hubner | 357/51 |
| 3,579,057 | 5/1971 | Stoller | 357/55 |
| 3,617,825 | 11/1971 | Chilton et al. | 357/76 |
| 3,697,831 | 10/1972 | Anderson et al. | 357/3 |
| 3,711,753 | 1/1973 | Brand et al. | 357/89 |
| 3,860,948 | 1/1975 | Ono et al. | 357/60 |

Primary Examiner—William D. Larkins
Attorney, Agent, or Firm—Gary C. Honeycutt; James T. Comfort

[57] ABSTRACT

Disclosed is a method for providing electronic semiconductor devices and the devices produced thereby utilizing an orientation dependent etch to selectively provide grooves in a monocrystalline silicon substrate having a crystal orientation of (110). By selectively etching with an orientation dependent etch to provide deep grooves having substantially parallel sidewalls and thereafter refilling with an appropriate material of the appropriate conductivity, a plurality of semiconductor electronic devices are provided.

4 Claims, 45 Drawing Figures

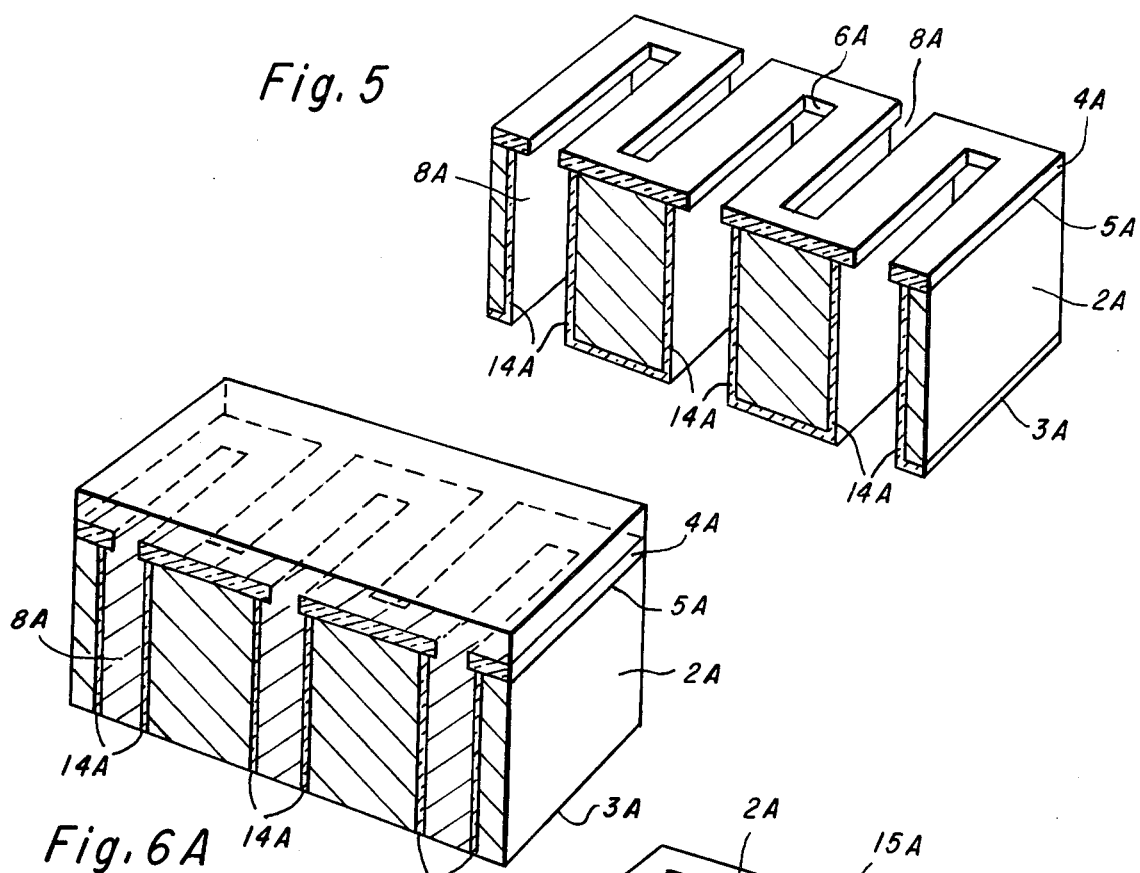
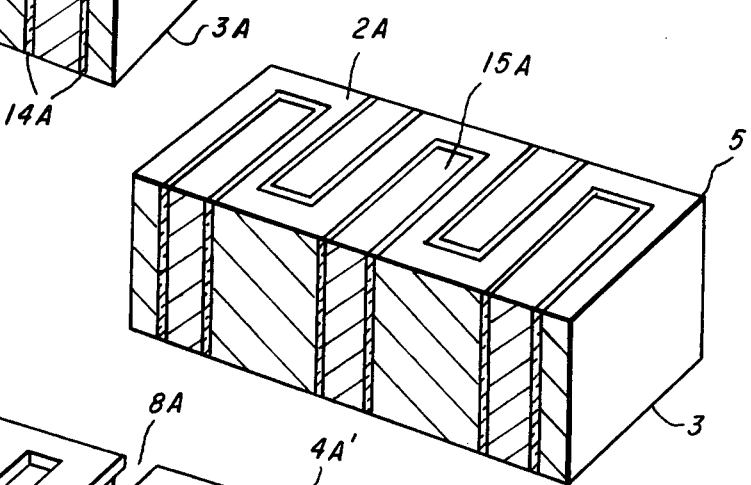
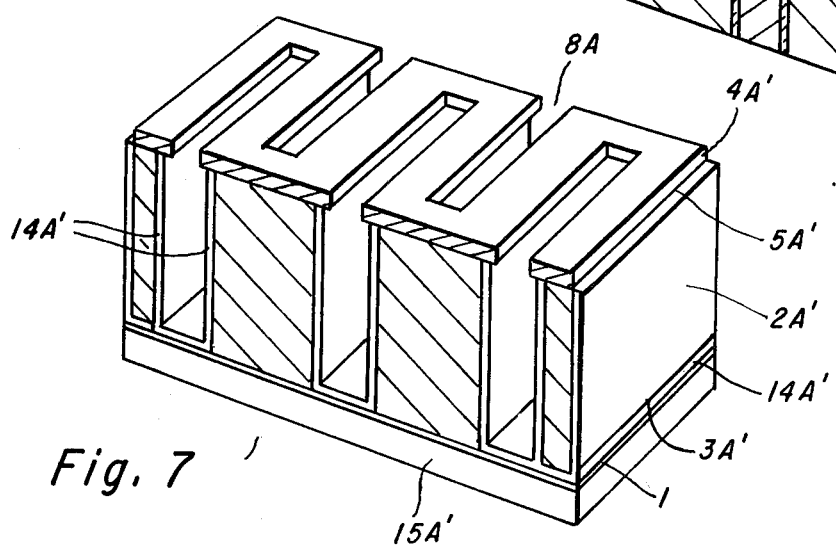

COMPOSITE SEMICONDUCTOR STRUCTURES

This is a division of application Ser. No. 276,808, filed July 31, 1972, now abandoned.

BACKGROUND OF THE INVENTION

In the manufacture of semiconductor components and integrated circuits, it is desirable to form individual acitve and/ or passive components comprised of single crystal semiconductor material. Various methods and techniques have been developed to form such components of single crystal semiconductor crystal so that the depth, conductivity, and lateral extent of doped regions of components may, to some extent, be controlled. Techniques heretofore employed in the formation of such components and devices have been ineffective in creating devices having well-defined and precisely controlled junctions. The term junction is herein defined as that region common to the abutment of two materials having dissimilar properties. Precisely defined junctions are denoted as junctions having substantially zero degradation with distance of the respective material characteristics of each abutting material near the junction. Precisely defined junctions are desirable to provide optimum operating device characteristics which heretofore have been unachievable utilizing conventional masking-etching-diffusion.

It is therefore an object of the present invention to provide a method of constructing semiconductor electronic devices having well-defined junctions therein. It is a further object of the present invention to provide devices having such well-defined junctions. It is another object of the present invention to provide semiconductor resistors having well-defined junctions therein and methods of making same. It is a further object of the present invention to provide diodes and stacks of diodes having well-defined junctions and methods of making same. It is yet a further object of the present invention to provide a solar cell having well-defined junctions therein and methods of making same. It is still a further object of the present invention to provide special property resistors having extremely controllable temperature coefficients of resistance with well-defined junctions therein and methods of making same. It is yet another object of the present invention to provide a magneto-photoconductor and methods of making same. It is still a further object of the present invention to provide a high voltage rectifier having well-defined junctions therein and methods of making same.

BRIEF DESCRIPTION OF THE INVENTION

The method of the present invention is generally described as a method of fabricating circuit components in a body of semiconductor material having a surface in the crystal orientation of (110). A mask is utilized to form a pattern on the (110) surface, which is parallel to the lines defined by intersection of the (111) planes with the (110) surface so that etching of a predetermined amount of the semiconductor material will form selectively positioned grooves therein; the walls of which are substantially perpendicular to the (110) surface. After forming the selectively etched grooves, the grooves are selectively refilled with a suitable material of an appropriate conductivity and type. Subsequent lapping steps remove excess materials to provide the desired structures.

The devices of the present invention are generally characterized as having junctions therein substantially perpendicular to a (110) crystal plane. The junctions are advantageously closely spaced which, when considered with the diverse materials which may be utilized to comprise the junctions, provide devices rendering functions heretofore unachievable in diminutive semiconductor structures.

To facilitate an understanding of the present invention, reference is made to the drawings, in which:

FIGS. 5–7 are perspective views illustrating various stages during the formation of a first resistor embodiment of the present invention;

DETAILED DESCRIPTION OF THE INVENTION

For purpose of illustrational simplicity and clarity, the figures contained herein are not geometrically proportioned. The dimensions given in the following detailed description of each figure are to be construed as exemplary dimensions and are not to be considered in disagreement with the drawings. Furthermore, as a plurality of embodiments have been illustrated, those embodiments having common elements with other embodiments have similar part number for clarity and simplification of description.

Figure 1:
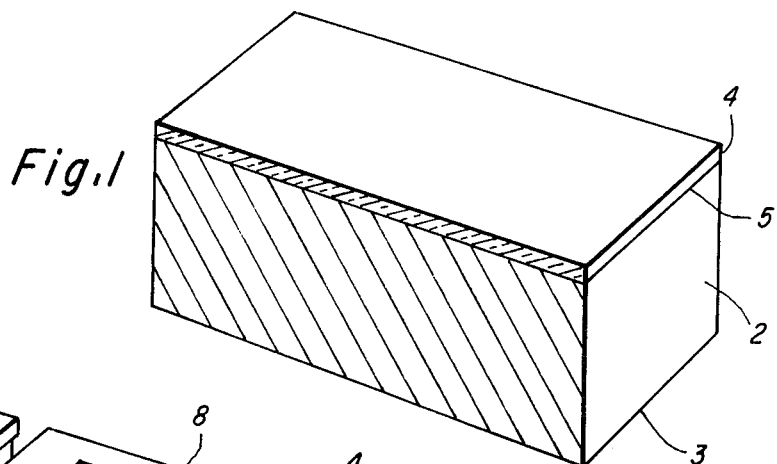
FIGS. 1–4 are perspective views typifying methods utilized in forming an intermediate structure of the present invention.

Referring now to the drawings, FIG. 1 illustrates a slice of semiconductor material 2 typically utilized in the invention. The slice 2 is monocrystalline silicon having, for example, a 20 ohm-centimeter resistivity, and typically may be p-type silicon doped with boron, gallium or other Group III elements. Such a substrate 2 is for purposes of a preferred embodiment only, and it is to be understood that conductivity and conductivity type are matters of design choice. Furthermore, other substrates besides silicon, such as gallium arsenide and germanium, are well-known to exhibit preferential etching along a particular crystallographic plane and accordingly are within the scope of this invention. One feature of the silicon slice 2 is that it has a crystal orientation of (110) as denoted by conventional Miller indices. Formation of (110) monocrystalline silicon material is well-known in the art and may be grown in ingots and sliced thereafter such that the resulting surfaces 5 and 3 are substantially coplanar with the (110) crystallographic plane. Accordingly, upper surface 5 and lower surface 3 of the slice 2 lie in the (110) plane. However, the slice may be cut such that the surfaces lie several degrees off the (110) plane in order to simplify subsequent processing. In such cases the walls of the grooves are still essentially perpendicular to the (110) plane. After removal from the ingot, the surfaces 3 and 5 are finished by conventional lapping, grinding or chemical polishing techniques. Substrate 2 is of any suitable length and width, but typically has a depth of 20 milli-inches (mils). Overlying upper surface 5 is a silicon nitride ODE resistant layer 4, which is deposited by any of the several well-known techniques in the art. Other well-known materials such as silicon dioxide are also suitable orientation dependent etch resistant layers and accordingly may be utilized as layer 4. Nitride layer 4 typically has a thickness of 2,000 angstroms when applied to a 20 mil substrate wherein a 15–20 mil ODE groove is to be etched.

Figure 2:
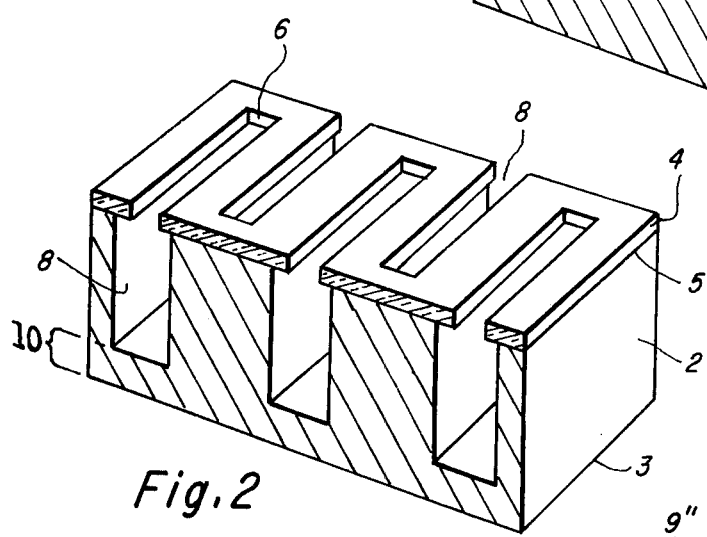

Conventional photolithographic-etch techniques provide a desired mask pattern in the nitride layer 4. Utilizing principles of alignment of the pattern in the oxide layer 4 which are well-known in the art of orientation dependent etch (ODE), apertures 6 in FIG. 2 are defined in the masked pattern substantially parallel to the line defined by the intersection of the (111) plane with the substantially (110) surface. It is to be understood that hereafter a (110) surface is denoted as a surface substantially lying in the (110) plane, which may lie at as much an angle as 20° to the (110) plane. Providing this angle may simplify subsequent processing steps such as evaporating a metal or insulating layer onto one sidewall of the ODE grooves. As is well-known, a (110) crystallographic orientation silicon body has two sets of (111) planes which are perpendicular to the (110) surface. One of the set of (111) planes intersects the other on the (110) surface at angles of 70.53° and 109.47°.

After etching the desired masking pattern in the oxide layer 4, with an exemplary pattern illustrated in FIG. 2 as a serpentine configuration, the substrate 2 is orientation dependent etched. That is, the moats formed thereby take the form of apertures 8 within the substrate 2, which are bounded by (111) planes, which sidewalls accordingly are perpendicular to the (110) surfaces 3 and 5. The etchant utilized exhibits a slower etch rate in the (111) plane than it exhibits in the (110) or other planes. Various etching solutions exhibit this property as is disclosed in *J. Electrochemical Society*, Vol. 114, 1967, page 965. For a more detailed explanation of the phenomena of orientation dependent etching (110) material along the (111) planes, reference is made to copending patent application, assigned to the assignee of this application, IMPROVEMENT IN METHODS FOR FORMING CIRCUIT COMPONENTS WITHIN A SUBSTRATE AND SEMICONDUCTOR SUBSTRATE, Ser. No. 788,177, filed Dec. 31, 1968 now abandoned.

A 50% potassium hydroxide/water mixture may be utilized for the orientation dependent etch. At 85° C. the etch rate utilizing such as etch in the (110) direction is approximately 0.087 mils per minute. Accordingly, a slice 20 mils thick would be completely etched in the (110) direction in approximately 230 minutes. As noted earlier, the grooves produced thereby are bounded by sidewalls substantially perpendicular to the (110) surface.

After etching the substrate for approximately 175 minutes, a groove 8 is produced in FIG. 2, which is approximately 15 mils deep. A longer etching time could provide a full 20 mil groove. The remaining 5 mils of substrate, which is denoted by numeral 10, provides a suitable mechanical support for ease in handling the slice. After removing the nitride layer 4, by conventional etching techniques, the basic structure depicted in FIG. 3 is provided, which is characterized as a body of silicon material having therein upper and lower surfaces 5 and 3 lying in the (110) plane; a selective pattern of orientation dependent etched grooves are bounded by sidewalls 9 which are substantially perpendicular to the (110) plane.

Figure 3:
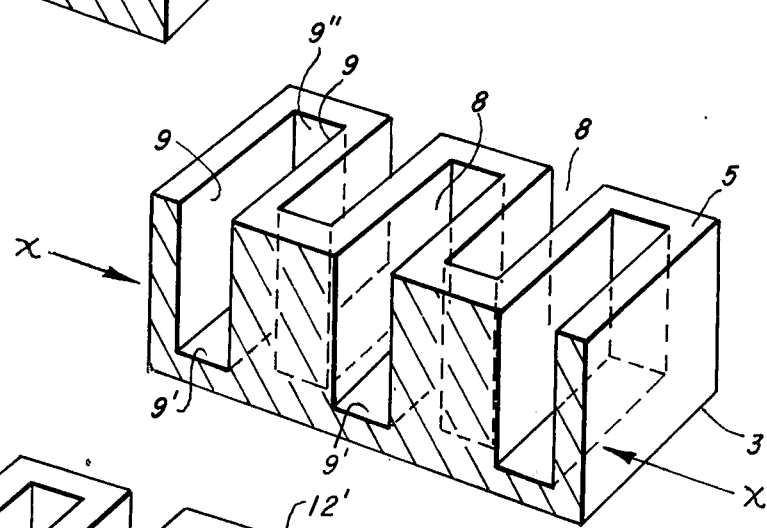

In FIGS. 2 and 3, the bottoms 9' of the etched grooves 8 may be either flat or notched in a V-shape depending on the width of the groove and other process details as is well-known in the art. Although depicted herein as having a flat shape, grooves having bottoms 9' notched in a V-shape are equally within the scope of this invention. It is emphasized that the particular mask pattern depicted in FIG. 2 is for illustrational purposes only. Accordingly, the exemplary resulting structure of FIG. 3 is appropriately modified by application of a different, selectively etched mask pattern in the masking layer 4 of FIG. 1. The various selectively etched mask patterns in the layer 4 are shown in detail in conjunction with the various embodiments subsequently described herein. The apertures in the pattern to be etched are substantially parallel to the intersection of the (111) plane with the (110) plane. The exemplary device of FIGS. 3 is a basic intermediate structure for several embodiments of this invention.

Figure 4:
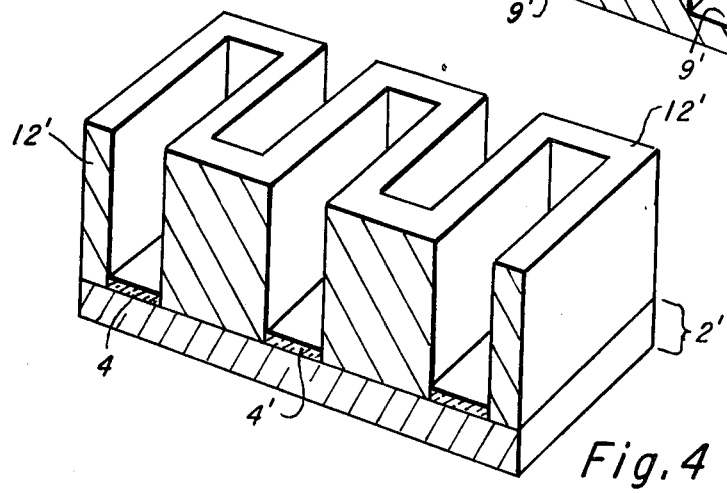

It is also noted that other techniques, well-known in the art, may be utilized to provide the exemplary basic device of FIG. 3. One such well-known method is that of orientation dependent epitaxial growth, as is explained in detail for a (110) crystallographic oriented silicon slice for growth in the (111) plane in copending patent application DIELECTRIC ISOLATION PROCESS, Ser. No. 171,665, filed Aug. 13, 1971 and assigned to the assignee of this applicaion. Further reference is directed to *THE INFLUENCE OF CRYSTAL ORIENTATION ON SILICON SEMICONDUCTOR PROCESSING* by K. E. Bean and P. S. Gleim, *Proceedings of the IEEE*, September, 1969. Utilizing the method of crystal growth there described, a (110) monocrystalline silicon substrate 2', as illustrated in FIG. 4, has thereover grown an oxide masking layer 4', having the desired masking pattern etched therein. In this structure, the substrate 2' is approximately 5 mils in thickness and the oxide layer 4' is 10,000 angstroms in thickness. According to the referenced process, the monocrystalline regions 12' are epitaxially grown perpendicular to the (110) substrate 2' and may be the opposite or same conductivity type as substrate 2'. The process is discontinued when the growth studs 12' reach the desired height of 15 mils to produce the basic desired structure of FIG. 3.

After having provided the structure of FIG. 3, variations in the subsequent processing steps, as described hereafter, provie a plurality of useful embodiments of the invention.

EMBODIMENT 1

Referring now to the particular masking pattern depicted in FIG. 5 a plurality of spaced grooves are etched parallel to each other and parallel to the intersection of the (111) plane with the (110) surface 5A, with alternate grooves extending to the edge of each respective side of the mask. That is, the apertures 6A in the nitride mask 4A do not extend completely across the width of the substrate 2. The orientation dependent etch is allowed to provide grooves 8A completely through the substrate 2A reaching surface 3A, as shown in FIG. 5. As explained earlier, utilizing the 50% potassium hydroxide/ water etch, the 20 mil slice is completely etched through to the surface 3 in approximately 230 minutes at 85° C. It is understood that the end walls 9" connecting slabs 9 do not necessarily extend perpendicularly to the (110) plane.

After the orientation dependent etch step, the structure is subjected, with or without removing nitride mask 4A, to an oxidation process to provide an oxide insulating mask 14A between the studs 12A. Any well-known oxidation process may be utilized, such as steam-heating. The oxidation step may be continued until the grooves 8 are fully filled with oxide 14A, which would eliminate the need for the polycrystalline fill material in the process hereafter described. The oxide layer 14A is typically grown to a thickness of 10,000 angstroms.

After completing the oxide growth step, polycrystalline silicon 15A is deposited within the grooves 8A overlying oxide layer 14A. Suitable techniques for depositing the polycrystalline silicon 15A are well-known in the art, with a typical process operating in an epi-reactor at 1200° C.

As isolation layer 14A provides isolation between the polycrystalline fill material 15A and the monocrystalline serpentine structure 2A, polycrystalline silicon of either type and of any conductivity may be utilized. It is to be understood that the oxide layer 14A need not be utilized if a subsequent polycrystalline fill 15A of conductivity type opposite that of the serpentine material 2A is utilized, thereby providing junction isolation.

After filling the grooves 8A with the oxide and polycrystalline silicon 15A as is illustrated in FIG. 6A, the excess oxide and polycrystalline silicon may be lapped, etched, polished, ground, or otherwise removed to a particular depth, which preferably is the original surface 5A. Likewise, any excess oxide and silicon lying beneath the original surface 3A is removed using such a lapping, etching, polishing or grinding technique. As shown in FIG. 6B, a resulting continuous serpentine region of doped monocrystalline silicon 2A intertwines among regions of polycrystalline silicon 15A or other suitable fill material. By applying electrical contact to opposite ends of the snake-like path, a semiconductor resistor is formed.

A variation of the above described sequence entails starting with a uniformly doped substrate of a particular conductivity, and modifying the conductivity by diffusing impurities into the monocrystalline snake-like regions to modify the conductance and provide a desired resistance. This diffusion is performed at any suitable time during the above described process.

A wide range of resistor values may be provided by the structure in FIG. 6b. Using the well-known equation for resistance of a parallelepiped, resistance, R is given by:

$$R = \rho L/A \qquad \text{Equation (1)}$$

where $\rho$ = resistivity of the semiconductor
L = length of the resistance path
A = cross-sectional area of the path Utilizing Equation 1 and choosing a desired doping level in the substrate 2A to provide a desired resistivity, and choosing a suitable length L and cross-sectional area A as determined by the orientation dependent etch, the wide range of resistor values which is provided by the resistor of FIG. 6b is apparent. For example, providing a resistivity of approximately 20 ohm cm which is provided in p-type silicon by a doping concentration of $6 \times 10^{14}$ atoms/cm$^3$, and choosing a length of 10 centimeters and a cross-sectional area $A = 15$ mils $\times$ 0.2 mils $= 3$ mils$^2 = $ approximately $2 \times 10^{-5}$ cm$^2$. Accordingly, $R = 20 \times 10/2 \times 10^{-5} = 10^7$ ohms.

AN ALTERNATE APPROACH TO THE FIRST RESISTOR EMBODIMENT

An alternate approach in providing the structure of FIG. 6B comprises, subsequent to the growth of oxide layer 14A', the formation of a layer of polycrystalline silicon 15A' or other suitable material such as a ceramic or a metal on the lower surface 3A' of the slice as illustrated in FIG. 7 instead of in the grooves 8A'. To provide a base upon which to form the layer 15A' on the surface 3A' a layer 1 is formed initially on surface 3A'. Such a layer 1 is comprised of any material sufficiently rigid which adheres to surface 3A' and further allows the formation thereon of the layer 15A'. One such common material is adhesive tape, but any sufficiently rigid adhesive suffices. Of course, layers 1 and 15A' may be formed on the substrate 2A' prior to the formation of layer 14A', such as initially formed on the substrate 2 of FIG. 1. This layer 15A' of polycrystalline silicon is grown to a sufficient thickness so as to provide a handle by which the slice can be transported and processed. When the process of filling the grooves with material 15A' as above described is finished, the polycrystalline "handle" on the back may be removed by etching or, if desired, the polycrystalline handle may be retained for mechanical strength without hindering device performance.

The polycrystalline silicon 15A' heretofore deposited in the grooves or on the bottom surface as a support handle may be of any conductivity and type in this embodiment, since the oxide 14A electrically isolates the serpentine resistor body. However, since there may be pinholes in the oxide layers 14A', it is advantageous to deposit high resistivity polycrystalline silicon. It is a further advantage to deposit n-type polycrystalline silicon, since p-n junction isolation then occurs at all pinholes. The earlier noted diffusion steps altering the conductivity of the silicon serpentine resistor of the first embodiment are equally applicable during this process. Depending upon the direction of diffusion, i.e., depending upon whether the diffused layer is produced on the walls of the groove, or applied to the top and bottom of the serpentine segment, a wide range of compensation is achieved in modifying the temperature coefficient of the resulting resistor.

Epitaxial silicon layers of any conductivity and type are also suitably deposited in the grooves as fill material 15A' as above described for the "polycrystalline handle." Similarly, other semiconductor materials, insulators or metallic layers may be deposited on the walls or other surfaces of the resistor structure; the only requirement is that subsequent groove filling operations not be impaired.

Although a p-type silicon substrate has heretofore been described, having a conductivity of 20 ohm-centimeters, it is to be understood that other substrates having other conductivities and type may be utilized. For example, 0.01 ohm-centimeter n-type GaAs is also suitably utilized as the substrate material. Utilizing a GaAs substrate, however, results in a groove having only one sidewall substantially perpendicular to the (110) plane. A suitable orientation dependent etch comprises $Br_2$—$CH_3OH$ as is well-known in the ODE art.

SECOND EMBODIMENT

Figure 8:
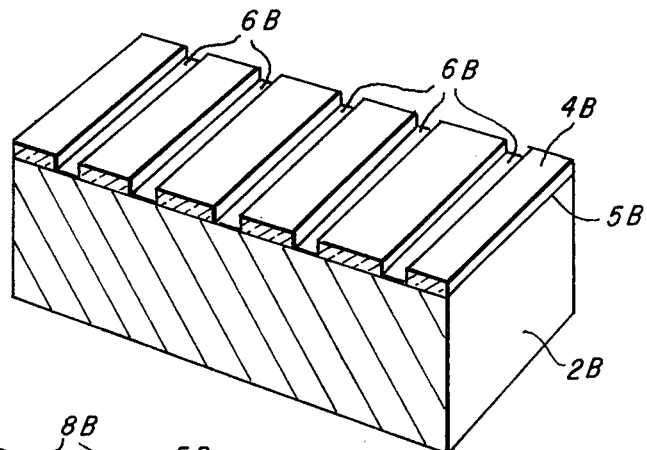
FIGS. 8–12 are perspective views illustrating various stages during the production of a second resistor embodiment of the present invention.

A second resistor embodiment of the invention is illustrated in FIGS 8-12. The semiconductor substrate 2B shown in FIG. 8 has the same essential electrical properties as earlier described for substrate 2 of FIG. 3. The masking layer 4B, however, has apertures 6B extending completely across the surface 5B, as shown in FIG. 8.

The orientation dependent etch process step proceeds until grooves 8B are etched to a desired depth, such as 15 mils into the 20 mil thick substrate 2B to be consistent with the earlier described embodiment. The remaining 5 mils of substrate provides mechanical support for ease of handling. After removing the nitride layer 4B, the intermediate structure illustrated in FIG. 9 results, which is the analagous structure to FIG. 3. It is again noted that, as in the structure of FIG. 3, the sides of the grooves 8B formed by the ODE are substantially perpendicular to surfaces 3B and 5B which lie in the (110) plane.

After etching the apertures and removing the masking nitride layer 4B, a layer of isolation oxide 14B is grown over the grooved upper surface. A sufficient thickness for this layer of oxide is approximately 10,000 angstroms. The thickness of oxide layer 14B is dependent upon the desired voltage breakdown characteristics which the finished device is to provide. Voltage breakdown characteristics for various thicknesses of oxide are well-known in the art. Thereafter, the grooves 8B are completely filled with material 15B such as polycrystalline silicon. Other materials suitably provide the filling materials 15B, such as ceramics. As oxide layer 14B also provides isolation, material 15B may be conductive without inhibiting device performance.

Figure 11:
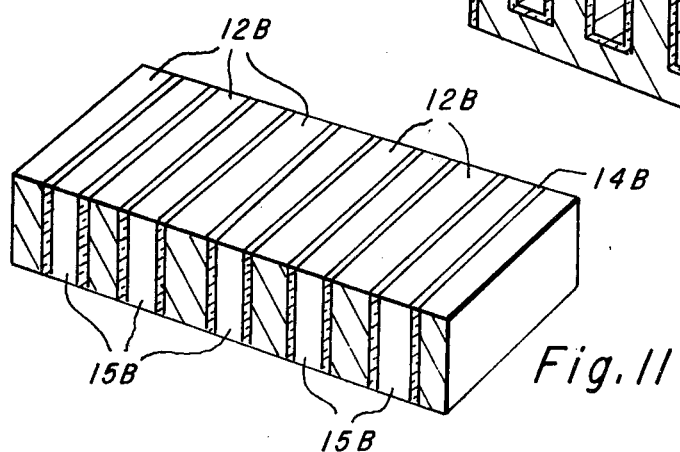

After lapping, etching or grinding the polycrystalline silicon and oxide coating lying above the surface 5B, and likewise after lapping or grinding the suface 3B to a depth of greater than 5 mils to provide surface 3B', the device of FIG. 11 is produced. That is, a plurality of doped monocrystalline silicon slabs 12B are separated by polycrystalline silicon "slices" 15B each of which polycrystalline slices is sandwiched between oxide layers 14B for electrical isolation thereof.

Figure 12:
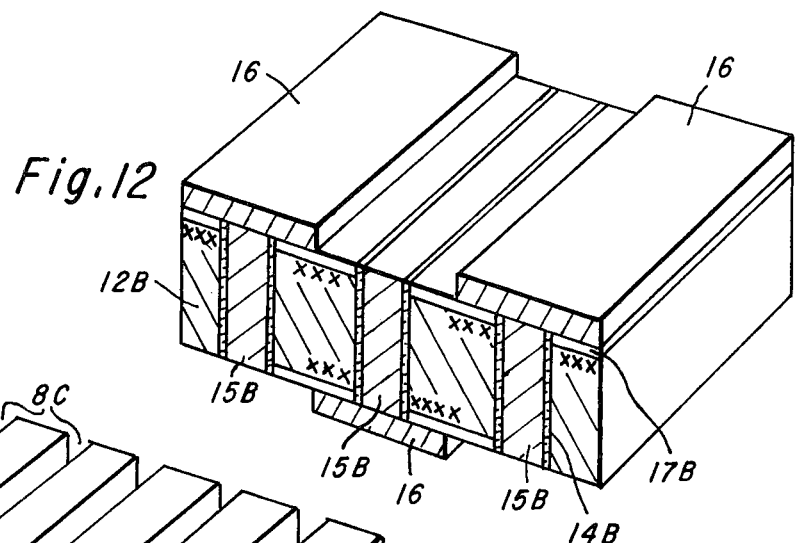

Metallic contacts 16, as shown in FIG. 12, are thereafter selectively deposited on the surfaces 5B and 3B to connect selected adjacent monocrystalline slices in such a pattern to form a substantially vertical serpentine path. By joining the proper number of slices 15B in such a series to produce a desired length, the desired total resistance is provided as per the resistance formula of Equation 1. As shown earlier with regard to Equation 1, conductivity, length and area of the resistor parallelepiped, are all variable. The starting conductivity of the substrate 2B is thus chosen to provide the proper resistance of the final resistor; i.e., in this embodiment one suitable conductivity is 20 ohm-centimeters. However, as explained in conjunction with the device of FIG. 6, a lightly doped monocrystalline substrate may be initially utilized, and thereafter a different concentration of dopant is selectively formed in the monocrystalline slices 50 to change the conductivity to provide a wide range of resistor values and temperature coefficients. A highly doped layer of diffusants 17 underlying each metal contact 16 provides a more suitable ohmic contact, as is well-known in the art.

Depending upon initial thickness of oxide layer 14B, the subsequent formation of polycrystalline silicon regions 15B may be unnecessary. That is, growing a sufficient thickness of oxide 14B allows the practical formation of metallic contacts 16 to reliably interconnect slices 15B. In such a case, of course, the oxide layer 14B may be only a few microns thick, then extremely narrow contacts 16 are required. Using a standard photolithography, a preferred minimum width of contact 16 is .1 mils, which is a design choice with considerations of current carrying capacity and reliability, as well as process practicability.

A THIRD EMBODIMENT — SPECIAL PROPERTY RESISTORS

Figure 9:
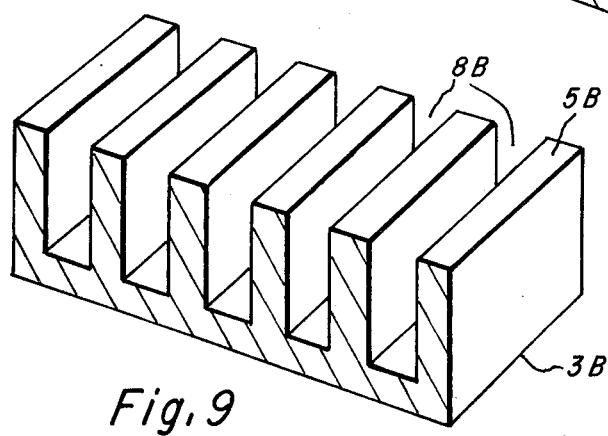
Figure 10:
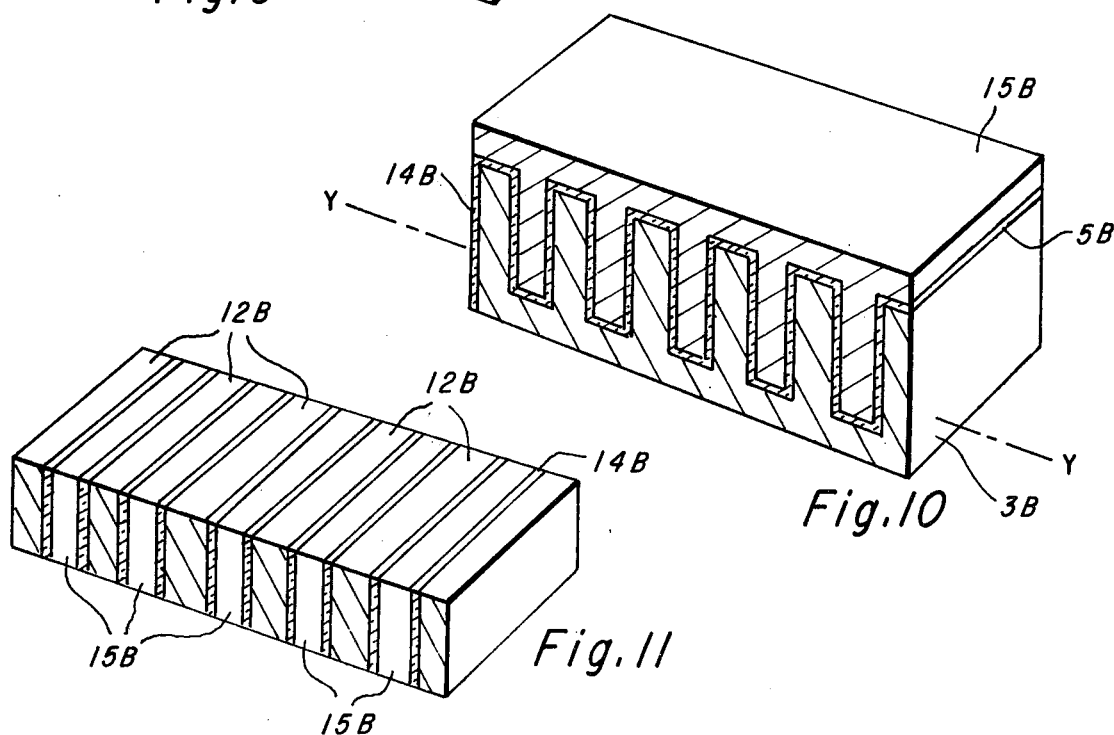
Figure 13:
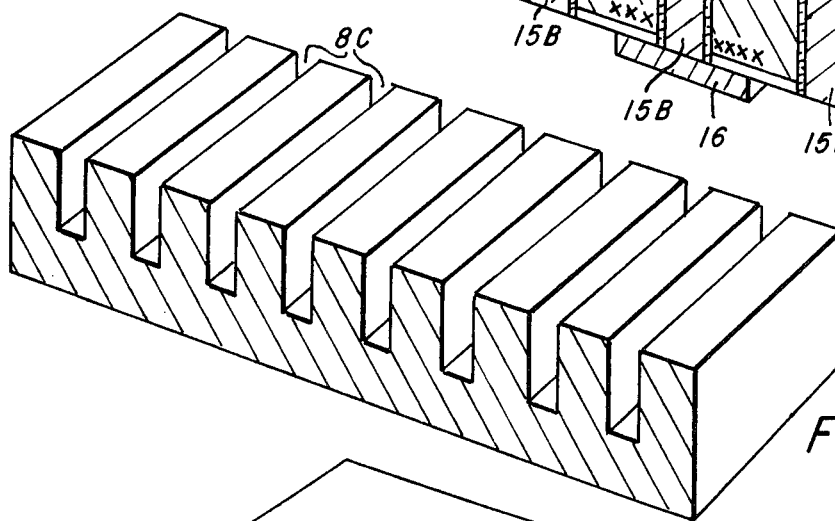
FIGS. 13–16 illustrate various steps in the production of a third resistor embodiment of the invention.
Figure 14:
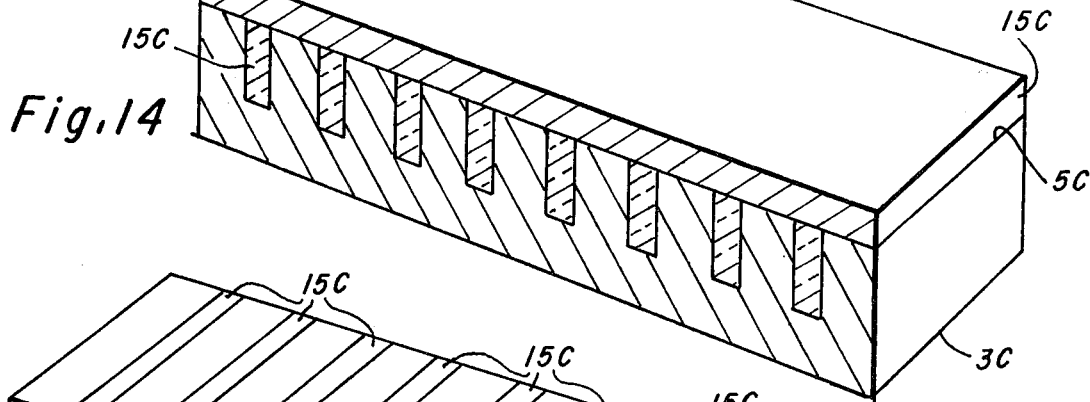

Referring now to the drawings 13-16, there is shown in sequence process steps for providing resistors having special properties, a third embodiment in accordance with the invention. In FIG. 13, the structure as provided in FIG. 9 is the generalized starting structure analogous to FIG. 3. The grooves 8C provided by the ODE to the typical 15 mil depth are filled by vapor depositing an appropriately doped semiconductor material to form regions 15C in FIG. 14. One suitable semiconductor material is N-type monocrystalline silicon which is vapor deposited utilizing well-known techniques in the art. Region 15C may suitably comprise a sequence of conductivity types epitaxially deposited using well-known techniques, or it may comprise polycrystalline fill material. The final device type and characterisitics determine the choice of fill material, as later discussed in detail. The N-type monocrystalline silicon has a wide resistivity range of, for example, $10^{-4}$ to $10^5$ ohm-centimeters, depending on desired characterisitics, as later discussed. The orthogonality of the sides of the monocrystalline regions to the surfaces 5C and 3C of the P-type substrate is again emphasized, due to the action of the ODE on the (110) substrate in the (111) plane. The parallel sidewalls of the grooves 8C allow precise junctions to be formed, giving easily predicted device characteristics.

Figure 15:
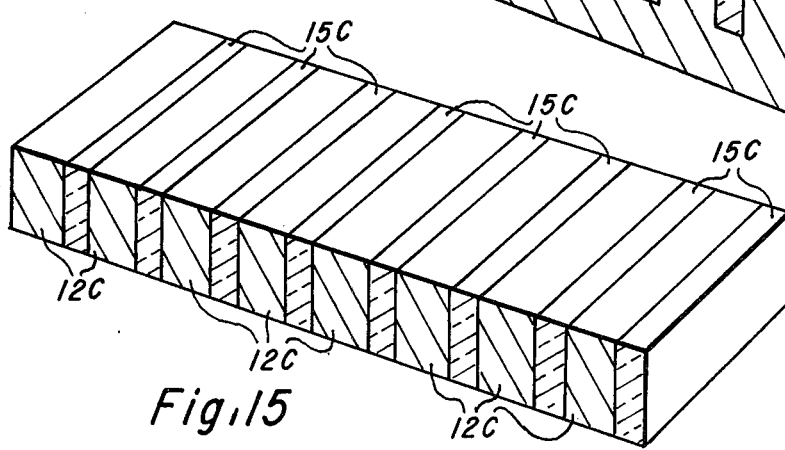

After filling the grooves 8C with the appropriate semiconductor material as discussed above, surfaces 5C and 3C are lapped, polished, or otherwise uniformly removed to provide the structure of FIG. 15. As illustrated, a plurality of adjacent P-N junctions results, 15C/12C, stacked side by side, each having parallel walls near the (111) crystal orientation plane. When electrical contacts 22C and terminals 21C are added to the extreme end regions and the structure is encased in, for example, an epoxy package 20 utilizing techniques well-known in the art, the completed device of FIG. 16 results.

Figure 17:
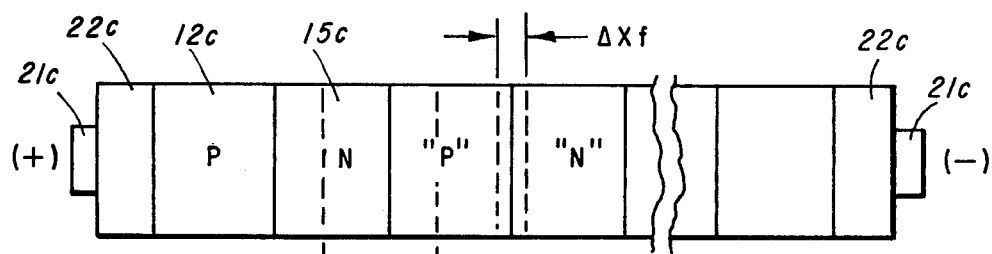
FIG. 17 depicts the operational mode of the device of FIG. 16.
Figure 18A:
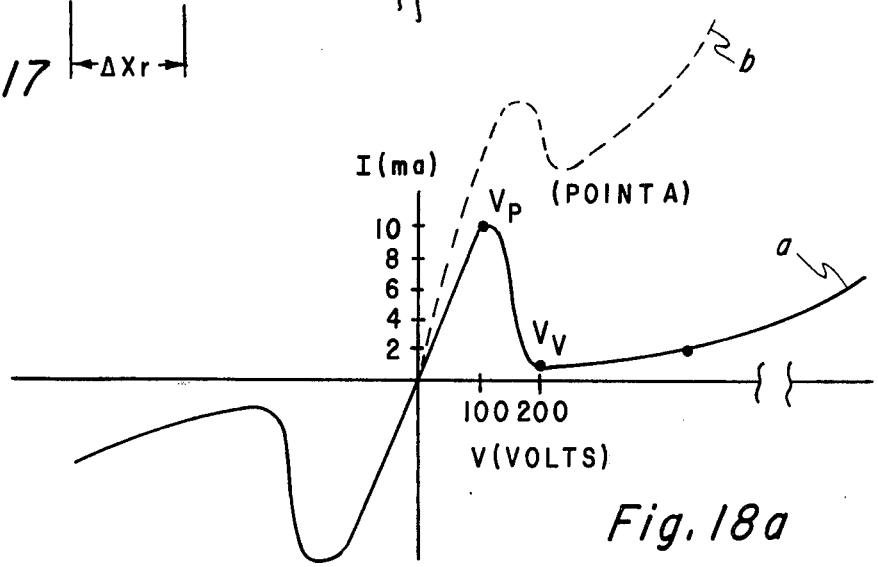
FIGS. 18a and 18b depict output electrical characteristics of stacked diode embodiments.

A preferred mode of operation is the application of an electrical potential to the electrodes 21C of the device to forward bias and reverse bias alternate P-N junctions. Forward biasing provides only a small space charge region on each side of the junction shown as $\Delta X_F$ in FIG. 17. Reverse biasing the junctions provides a wider space charge region in the junction denoted by $\Delta X_R$ in FIG. 17. The resistance of the device of this embodiment having adjacent P-N junctions is extremely voltage dependent. Referring to FIG. 18a wherein applied voltage is plotted versus current flow for a device of 1000 stacked P-N junctions having P and N resistivities of 0.001 and 0.002 ohm-centimeters, respectively, the resistance at a particular voltage is the instantaneous slope at that voltage, wherein slop (M) is defined.

$$M = I(1) - I(2)/V(1) - V(2) \qquad \text{Equation (2)}$$

where

I ($i$) is current at ordinate ($i$)

V($j$) is voltage at ordinate ($j$) and

V(1) − V(2) approaches zero.

The resistance of such a device is relatively constant up to the peak voltage $V_p$, and then the resistance becomes negative as the voltage is increased above $V_p$.

Due to the near unlimited choice of conductivities of the N- and P-regions a wide range of voltage resistance characteristics is achieved, with several relationships typified in FIG. 18a. For example, if both P- and N-type regions were doped to approximately $10^{20}$ atoms per cc (0.0013 and 0.001 ohm-centimeter resistivity, respectively), one would have a device exhibiting the characteristic of multiple tunnel diodes connected in series.

Graph of FIG. 18a is, as stated above, for 1000 P-N junctions in series. A typical diode as above described may have a peak current density of 100 amps/cm². Assuming a cross-sectional area of $10^{-4}$ cm², then peak current through the P-N junction is 10 milliamps and typically this occurs at about 0.1 volts for a single junction. Accordingly, the resistance R for voltages less than 0.1 volts equals 10 ohms for a single forward biased junction. The resistance of such a junction when reverse biased is also about 10 ohms, which stays relatively constant up to 1 volt. Thus, for a series of 1000 junctions the resistance up to 100 volts is 10,000 ohms. That is, since the device comprises in operation 500 forward biased junctions and 500 reverse biased junctions, assuming a forward peak voltage of 0.1 volts, then 100 volts are needed before negative resistance commences and 200 volts are required to reach the minimum current. In the region wherein $V_F$ for a single junction is greater than 0.2 volts and less than 0.5 volts, the resistance is approximately 200 ohms per forward biased P-N junction, and is 10 ohms for each reverse biased junction. Accordingly, for 1,000 junctions, the resistance is 105,000 ohms between 200 and 500 volts. It is noted that in FIG. 18a the device characteristics are symmetrical, in that an oppositely opposed voltage application forward and reverse biases the same number of P-N junctions.

However, the device characteristics need not be symmetrical with respect to voltage polarity. Before filling with $n+$ material, for example, one can directionally implant boron to a depth of 0.5 $\mu$m to a peak concentration of $4 \times 10^{20}$ atoms/cc on one wall of the groove and follow this by an arsenic implant to a depth of 0.2 $\mu$m to a peak concentration of $4 \times 10^{20}$ atoms/cc on the same wall, which converts the P+ stud into a P+−P++−N++$^{stud}$. Filling this structure with N+ material having a concentration of $10^{20}$ per cm³ as before, the repeating sequence is: P+P++N++N+P+P++N++N+..... This structure provides the I-V character shown in FIG. 18a curve b.

In a similar fashion, starting with lightly doped P-type Si produces a P P++N++$^{N+}$PP++N++N+.... structure which provides other advantageous I-V characteristics.

Figure 16:
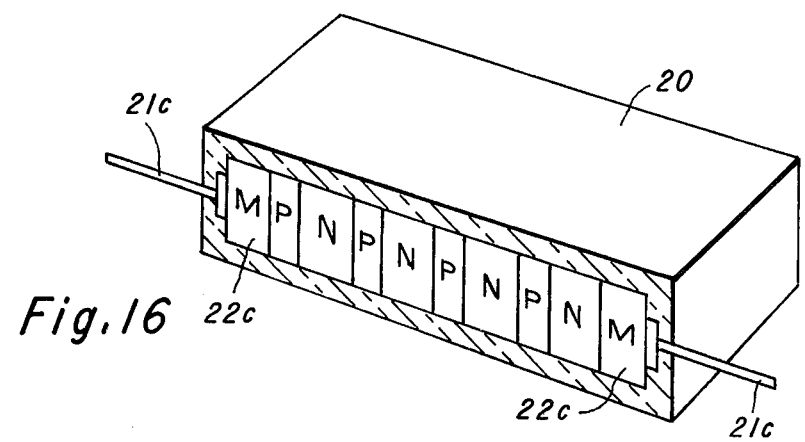

By providing a proper choice of conductivities for the P-N junction stack depicted in FIG. 16, a temperature compensated structure results which has a highly controllable temperature coefficient. As is well-known in the art, silicon diodes having a reverse breakdown voltage, $V_b$, greater than about 7.0 volts at 300° K have a positive temperature coefficient for $V_b$. Conversely silicon diodes having a $V_b$ less than 6 volts have a negative temperature coefficient for $V_b$. That is, a negative temperature coefficient (TC) is characterized by a $V_b$ which decreases as temperature increases. Likewise, a positive temperature coefficient material is characterized as having a $V_b$ which increases as temperature increases. In the range of $V_b$ greater than 6 volts, and less than 7 volts, silicon diodes have a temperature coefficient very near zero and accordingly such devices are advantageous as voltage control devices over a varying temperature range. By appropriately doping the device of FIG. 16, such that $V_b$ is approximately 6.5 volts per junction, then the breakdown voltage of the resulting device is 6.5 N where N is the number of stacked reverse biased diodes.

Besides vapor depositing N-type semiconductor material to obtain the plurality of P-N junctions, material of the same type as the substrate 2 would also suitably be deposited having any suitable conductivity to provide a device readily temperature compensated. That is, a device results which may have either a positive, a negative or a zero temperature coefficient of resistance (TCR). Application of such a device is particularly useful in situations wherein a very low temperature coefficient is desired over some range of temperature. By designing the structure such that the substrate and vapor deposited material have opposite algebraic signs for TCR, it is generally possible to design a resistor having the desired low TCR over the specific temperature range.

Examples of such a resistor designed to have a desired low TCR over a specific temperature range is apparent from viewing FIG. 25 in conjunction with the detailed theoretical explanation thereof, Infra, page 22.

Figure 19A:
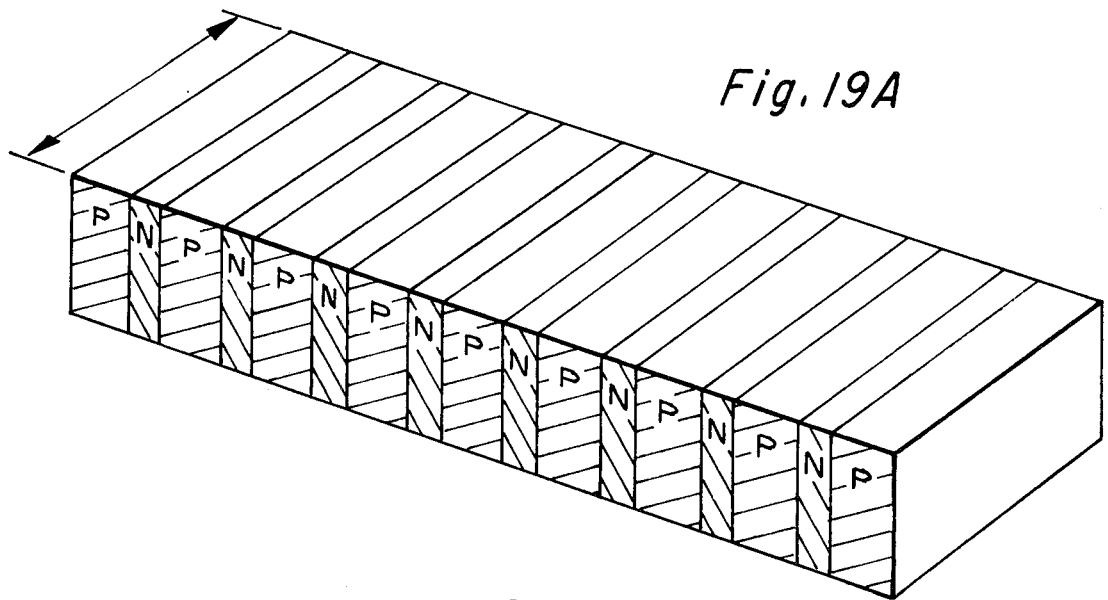
FIG. 19a illustrates the orientation of the plurality of junctions having substantially vertical sidewalls.
Figure 19B:
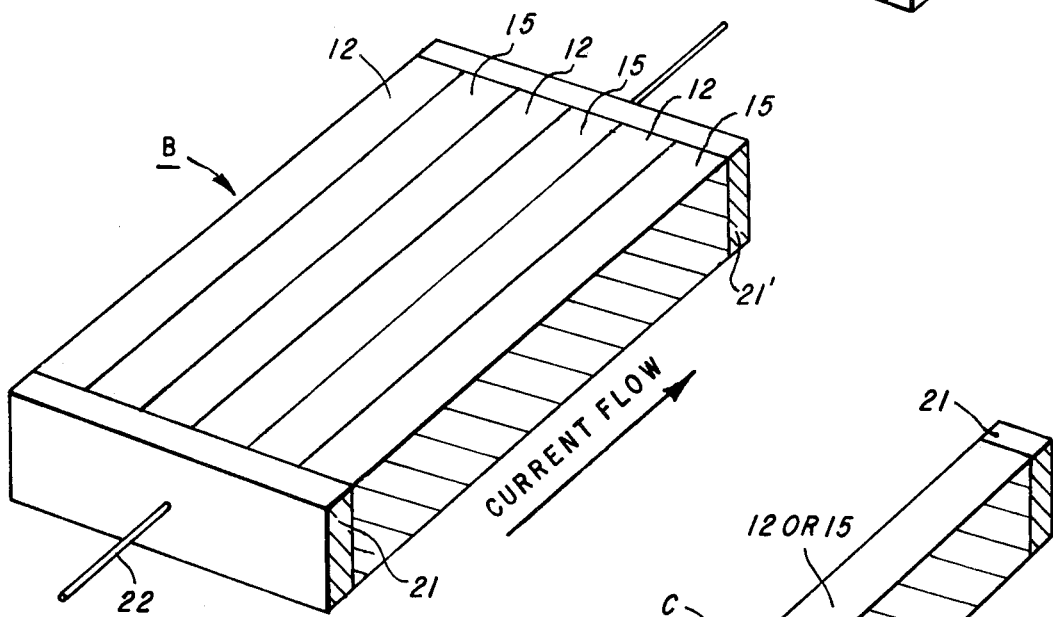
FIGS. 19b–19d illustrate devices comprising various orientaions of the junctions.
Figure 19C:
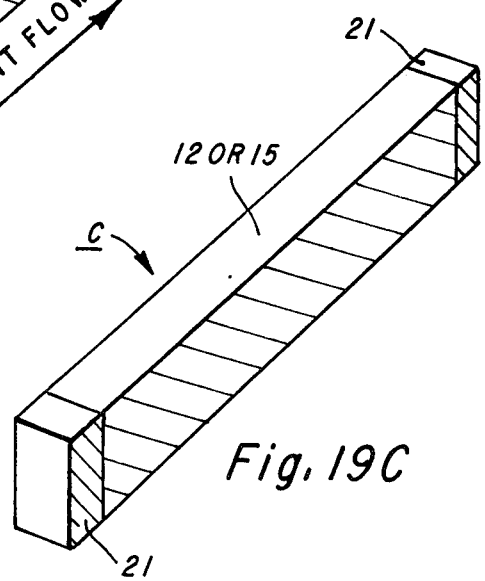

Besides the choice of conductivities in the P- and N-type regions, the finite resistor structure may be selectively cut or sawed from the P-N junction stack of FIG. 19A, which is the top view of FIG. 15, in various orientations. Each P-N junction, or sidewall, is perpendicular to the (110) plane and lies in the (111) plane, yet the final characteristic of the structure is dependent upon electrical current flow. The current flow depends upon the orientation of the cut; that is, the orientation of the P-N junction or sidewalls to the longitudinal axis of the final device. For example, sawing the P-N junction stack of FIG. 19A such that the P-N junctions are perpendicular to this longitudinal axis (current flow is perpendicular to the junctions) results in the voltage dependent resistor of FIG. 16. However, at the other extreme of orientation, a device sawed such that the P-N junctions are parallel to the longitudinal axis of the final device, as denoted by the resistor B in FIG. 19B, provides a device having a much lower resistance and completely different electrical characteristics. The resistor B of FIG. 19B may be cut sufficiently thin or otherwise constructed such that only one vertical monocrystalline slice 12 or vertical polycrystalline slice 15 comprises the entire resistor C of FIG. 19C. Then, accordingly, a junctionless device having well-known doped silicon resistor characteristics is produced.

Figure 19D:
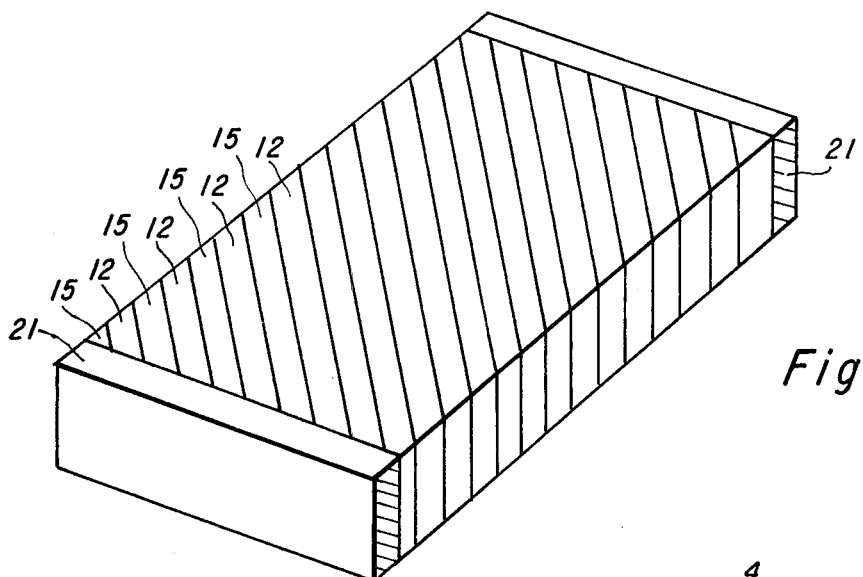

Also obtainable by a wider cut of the "B type" in FIG. 19B is a resistor encompassing a plurality of P-N "slices" extending parallel to the longitudinal axis as in resistor B. By the proper choice of $\rho_P$ and $\rho_N$ and the proper selection of geometry, a wide range of temperature compensated resistors results. Although only extreme orientation cuts have been herein described, devices cut at an angle, such as resistor D in FIG. 19D, results in a combination of the electrical characteristics of the resistors in FIGS. 19A and 19B heretofore described.

Contacts 21 and 21' may suitably be ohmic to either or both N and P type regions 15 and 12. The term ohmic refers to a contact having linear I-V characteristics over a voltage range of either polarity and a specific resistance of less than $10^{-1}$ ohms - $cm^2$. Furthermore, contact 21 may be ohmic to P-type and rectifying to N-type, as for example a Pt-Si (platinum silicide) contact. Contact 21' may be ohmic to N-type and rectifying to P-type, for example, an alloy contact comprising gold doped with antimony.

As voltage potential is applied to the device of FIG. 16, current flows in a transverse direction to the P-N junctions. Referring to the original surfaces 5 and 3 of the device from which this diode stack was cut, it is noted that current flows through the volume of the original slice and does not merely flow at its surfaces as in conventional devices. These devices accordingly utilize all the volume of the slice as an active element and not just the region near the original surface. This feature is common to many of the embodiments of this invention.

FOURTH RESISTOR EMBODIMENT

Figure 20:
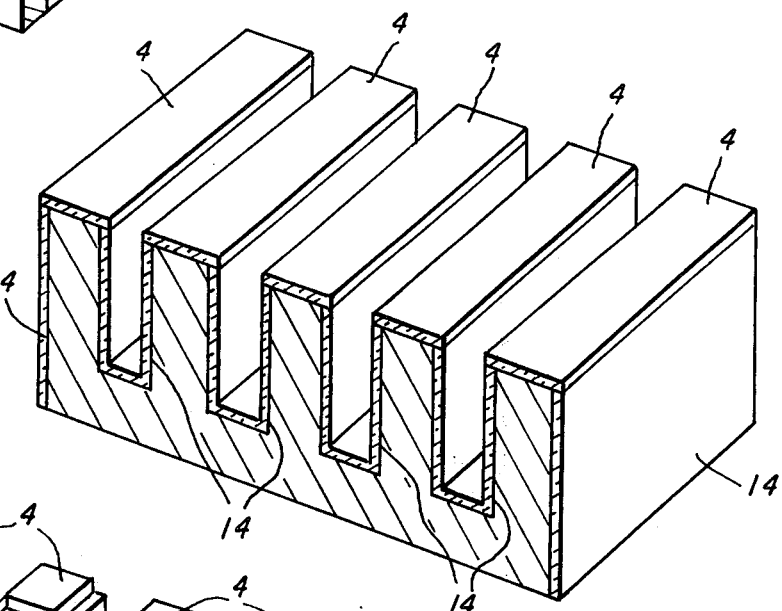
FIGS. 20–24 are perspective views of the various steps in providing a fourth resistor embodiment of the present invention.
Figure 21:
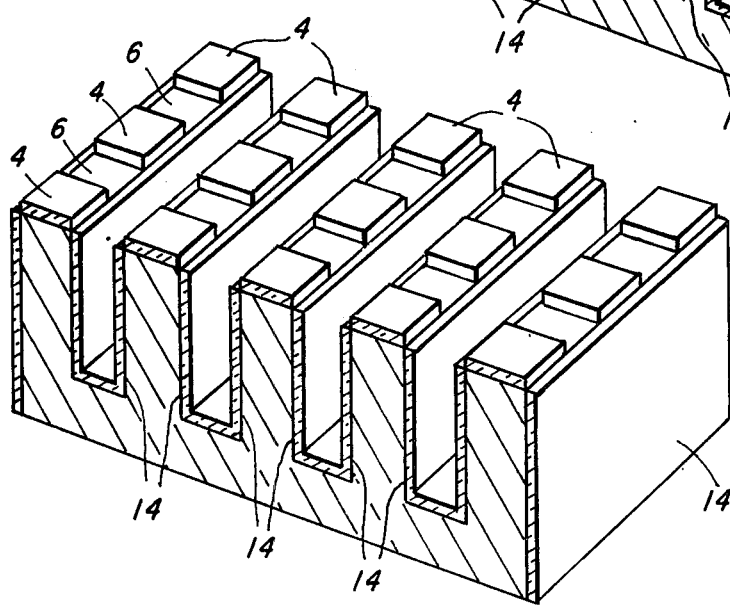

A fourth useful resistor embodiment results when the device of FIG. 9 is subjected to a second orientation dependent etch step. As earlier described, the oxide insulating layer 14 is grown to a depth of typically 10,000 angstroms as shown in FIG. 20, with nitride layer 4 remaining after the ODE. By coating the grooves with oxide 14 as shown and selectively removing portions of nitride mask 4 to form apertures 6 therein, the structure of FIG. 21 results. Such an upper surface with masking layers 4 and 14 is similar to the first masking pattern for the first ODE step. This second masking pattern also has the sides of its aperture cut parallel to the intersection of (111) plane with the (110) surface. It has been earlier noted that two such (111) planes intersect the (110) surface, and specifically they intersect at angles of 70.53° and 109.47°, respectively. The structure of FIG. 22 is a very useful intermediate structure in providing semiconductor resistors having unique properties, as will be explained hereafter.

Figure 22:
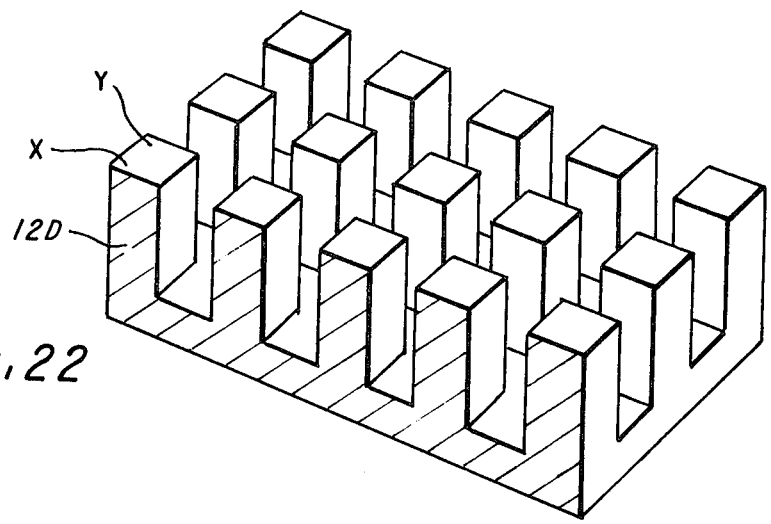
Figure 23:
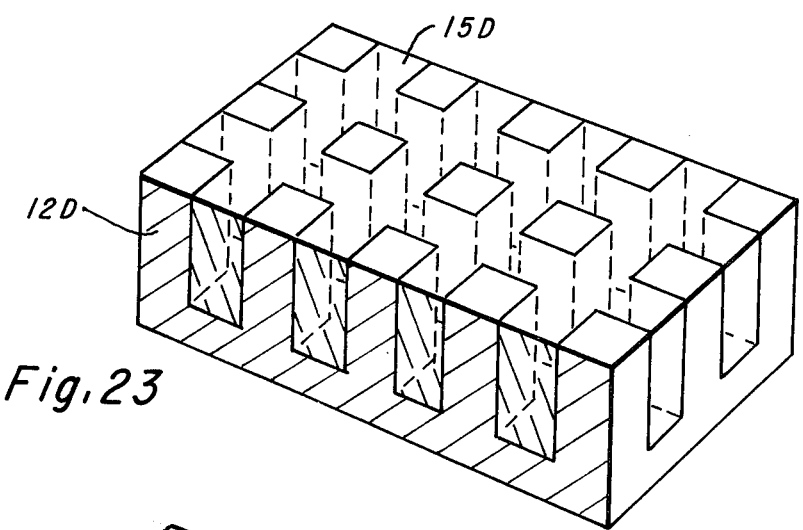

After removing all of the oxide in the grooves formed in the cross-hatched structure of FIG. 22, semiconductor material 15D of the appropriate conductivity and type is then selectively placed therein utilizing for example vapor deposition, as shown in FIG. 23. As the mesas 12D are of one conductivity, the semiconductor material 15D subsequently deposited is of a second desired conductivity, $\rho_2$, to give a desired temperature coefficient or other characteristic. Typical conductivities and types are hereafter given.

Figure 24:
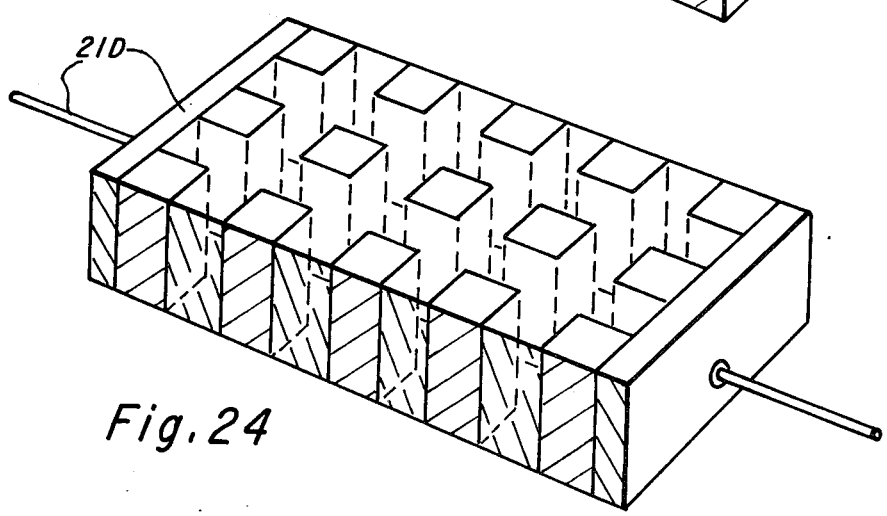

The completed structure in FIG. 24 has had electrical contacts 21D added to provide a resulting device which is thermally stable and is readily adaptable to have a wide range of temperature compensation.

Figure 25A:
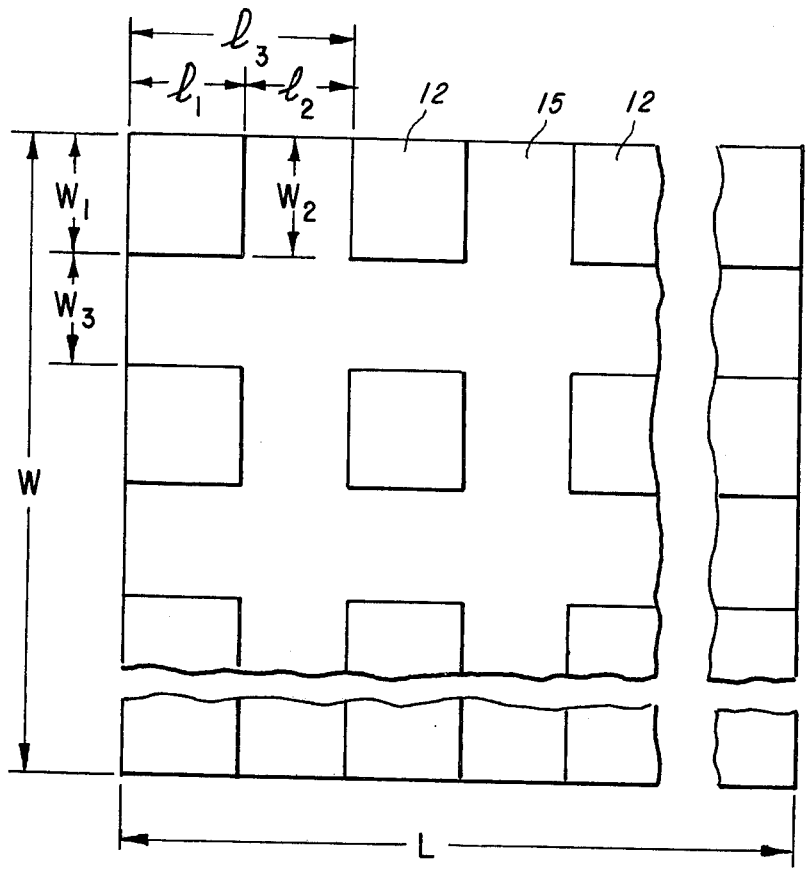
FIGS. 25a –25d depict dimensional view, an equivalent circuit, and electrical characteristics of the device of FIG. 24.
Figure 25B:
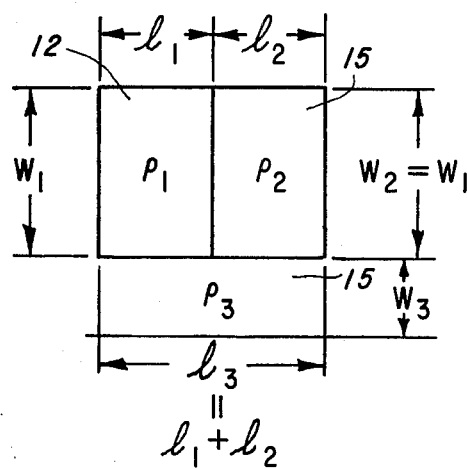
Figure 25C:
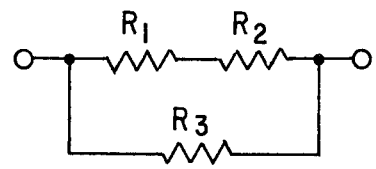
Figure 25D:
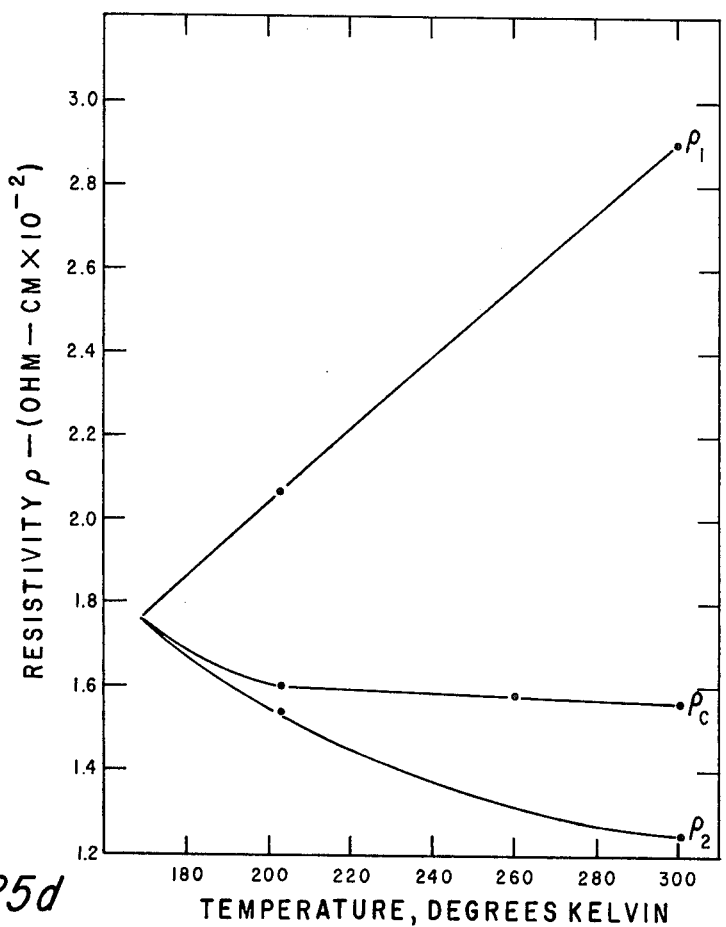

Referring to FIGS. 25a–25d, FIG. 25a depicts a dimensioned top plan view of FIG. 24; FIG. 25b depicts a basic structural unit comprising the view of FIG. 25a; FIG. 25c depicts a resistive network analogous to the basic unit depicted in FIG. 25b, and FIG. 25d depicts resistivity versus temperature of two materials having resistivities $\rho_1$ and $\rho_2$ at room temperature of $2.9 \times 10^{-2}$ ohm-cm and $1.3 \times 10^{-2}$ ohm-cm to provide resistivity $\rho_c$ of the invention. Therefrom, the choice of conductivities and dimensions become apparent to provide the temperature compensation desired.

Shown in FIG. 25a is an array comprising N-rows by M columns of mesas 12 separated by semiconductor fill material 15 of a desired conductivity and type. As is well known in the art, the resistance $R_T$ of a resistor structure of length L, width W and thickness T is given in terms of the resistivity by the expression:

$$R_T = \rho_T L/wt \qquad \text{Equation 3}$$

Thus, the resistance of the composite resistor $R_T$ of FIG. 24 is written as:

$$R_T = \rho_T \frac{N(l_1 + l_2)}{M(W_1 + W_3)t} . \qquad \text{Equation 4}$$

and that $R_c$ of the basic respective unit FIG. 25b as:

$$R_c = \rho_c \frac{l_1 + l_2}{(W_1 + W_3)t} \qquad \text{Equation 5}$$

using the circuit analogue of FIG. 25c and applying Equation 3 to the regions of $\rho_1$, $\rho_2$ and $\rho_3 = \rho_2$ comprising the structure, the resistance of the basic respective unit is expressed also as:

$$R_c = \frac{(\rho_1\rho_2 l_1 + \rho_2^2 l_2)(l_1 + l_2)}{(\rho_1 l_1 W_3 + \rho_2 l_2 W_3 + \rho_2 l_1 W_1 + \rho_2 l_2 W_1)} \qquad \text{Equation 6}$$

solving Equations 5 and 6 for $\rho_c$ gives:

$$\rho_c = \frac{(W_1 + W_3)(\rho_1\rho_2 l_1 + \rho_2^2 l_2)}{(\rho_1 l_1 W_3 + \rho_2 l_2 W_3 + \rho_2 l_1 W_1 + \rho_2 l_2 W_1)} \qquad \text{Equation 7}$$

It thus is readily apparent that the resistivity of the repetitive cell (and accordingly the composite structure of FIG. 24) is directly dependent upon conductivity and dimensions, which parameters are easily chosen to provide the desired characterization. Accordingly, the desired final structure may be provided by supplying the appropriate resistivity materials to a fixed dimensioned device or by scaling the dimensions to accommodate fixed resistivities, and temperature coefficients of the materials.

The temperature coefficient of resistance (TCR) of a resistor is defined at any temperature T by:

$$TCR = (dR/dT)\,1/R \qquad \text{Equation 8}$$

Assuming that thermal expansion is neglected, application of Equation 8 to Equation 6 gives for the TCR of the composite structure:

$$TCR = \frac{\frac{\delta\rho_c}{\delta\rho_1}\frac{d\rho_1}{dT}}{\rho_c} + \frac{\frac{\delta\rho_d}{\delta\rho_2}\frac{d\rho_2}{dT}}{\rho_c} \qquad \text{Equation 9}$$

utilizing the well-known chain-rule for differentiation.

Solving Equation 9 with "$\rho_c$" equal to $\rho_c$ of Equation 7 and assuming that $l_1 = l_2$ and $W_1 = W_3$, with $\rho_1$ and $\rho_2$ as parameters provides:

$$TCR = \frac{2\rho_1^2\left(\frac{d\rho_1}{dT}\right) + (3\rho_2^2 + 2\rho_1\rho_2 + \rho_1^2)\left(\frac{d\rho_2}{dT}\right)}{(\rho_1\rho_2 + \rho_1^2)(\rho_1 + 3\rho_2)} \qquad \text{Equation 10}$$

FIG. 25d graphically illustrates Equation 7 plotted as a function of temperature with the parameters $\rho_1$ and $\rho_2$ =2.9 × 10$^{-2}$ and 1.3 × 10$^{-2}$ ohm-cm, respectively, at 300° K. Such resistivities are provided by silicon doped with arsenic to a carrier concentration of approximately 1.3 × 10$^7$ and 2 × 10$^{18}$ atoms/cm$^3$, respectively. It is readily apparent that the TCR of one composite resistor between 200° K and 300° K is substantially zero.

The view of FIG. 25 also is useful in understanding the other substantial embodiments of this invention. For instance, when $W_3 = 0$, then the stacked junction device of the Third Embodiment, shown in FIG. 16, results. If $\rho_1$ and $\rho_2$ are of opposite conductivity types and $W_3 = 0$, then the diode stack earlier described is depicted. The TCR concept above described is generally applicable to a P-N junction stack, if a proper voltage range is designated. Also when $W_2 = 0$, and $\rho_1 = \rho_2$, the parallel stripe resistor of FIG. 19B is provided.

FIFTH EMBODIMENT — MAGNETO-RESISTOR AND MAGNETO-PHOTOCONDUCTOR

Figure 26:
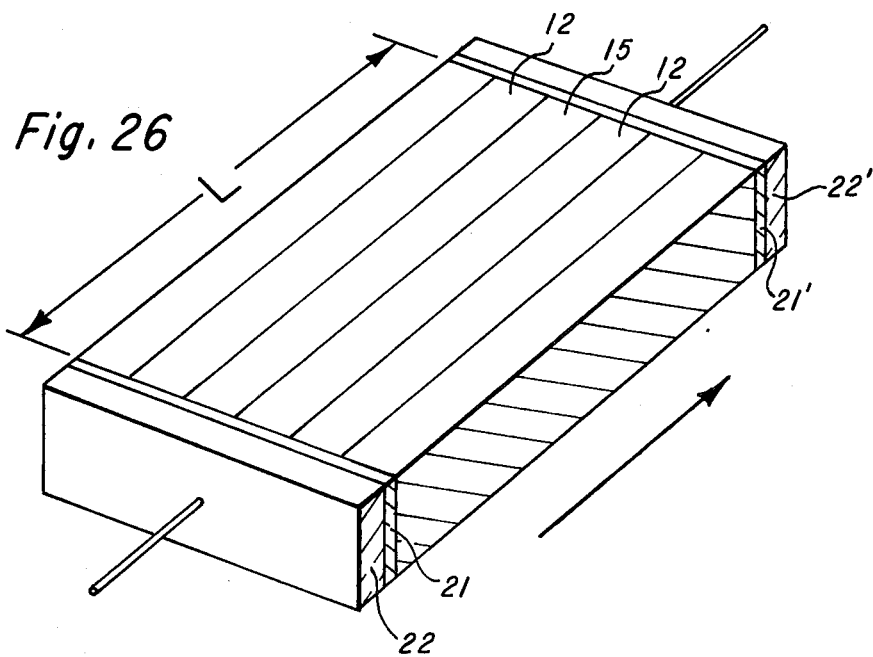
FIGS. 26–27 illustrate another embodiment of the invention forming a magneto photoresistor.

FIG. 26 depicts resistor B of FIG. 19B. Although depicted in FIG. 26 as having equal widths, P-type region 12 may have a width either narrower or wider than that of N-type region 15, depending on the desired properties. Using techniques earlier described, the desired widths are readily provided by providing the appropriate apertures 6 in the nitride ODE mask 4 prior to etching.

A typical device comprising this embodiment of the invention is silicon with a resistivity in the N-type region 15 of 1000 ohm-centimeters. By providing in region 15 a phosphorus (donor) concentration of 5.05 × 10$^{14}$/cm$^3$ and a gold (acceptor) concentration of 5.0 × 10$^{14}$/cm, such a resistivity is provided. However, the P-type region 12 is highly doped with, for example, boron to a resistivity of 0.04 ohm/cm, which is provided by a boron concentration of 1.0 × 10$^{18}$ atoms/cm$^3$. Heavily doped region 21, having at least a concentration of 10$^{18}$ atoms/cm$^3$ of N-type impurity, such as phosphorus and region 21' having at least 10$^{18}$ atoms/cm$^2$ of a P-type impurity provides regions to which metallic contacts 21 and 22' are applied.

The preferred length of the device depends on the desired sensitivity to the magnetic field and/or magnetophotoconductance, as well as whether the device is operating as a majority carrier device, as a single injection device, or as a double injection device.

A typical length, L, for the device shown in FIG. 26 is 10 mils, with each lightly doped N-type region 15 having a 2 mil width and a 5 mil thickness, and the heavily doped P-type region 12 having a 0.01 mil width. A magnetodiode device over which this invention is an improvement is described in an article entitled "Silicon Magnetodiode" by M. Arai and T. Yamada in Japan J. Appl. Phys., 40 *Supplement,* page 93, 1971. The "multiple stripe" magnetoconductor of this invention provides advantageous features of the above referenced device by providing sidewall recombination regions totally immersed in the "multiple stripe" device.

The "parallel stripe" geometry structure of FIG. 26 having electrical current passing down the length of the stripes is advantageously utilized as a magneto-resistor. As the highly doped P-region 12 is suitable concentration in proportion to the conductivity of the lightly doped N-region 15, the majority of current flow is in the lightly doped N-regions, and it is critically controlled by H-field variations passing therethrough. In such a structure as embodied in FIG. 26, the current flow is sharply reduced in the N-material by the presence of an H-field, either into or out of the N-material, since the electrons are then forced into the P+ regions, or into the space charge regions between the P+ and the N− regions, where recombination occurs.

Figure 27:
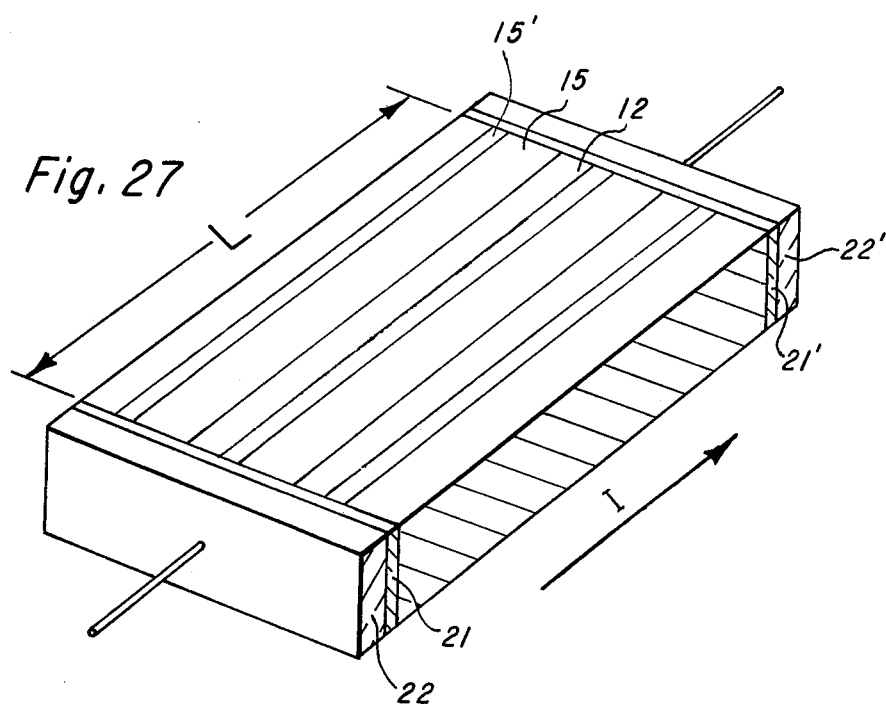

By directional ion implantation and/or other methods as discussed earlier with regard to the asymmetric tunnel diode stack, the magnetosensor advantageously provides asymmetric device characteristics. That is, with respect to the direction of magnetic field, H, the resistance decreases for H downward and increases for H directed upward. This device asymmetry is provided by depositing a thin N+$^{15'}$ layer on one side of the P+ layer 12. FIG. 27 depicts this asymmetric structure having N+N−P+N+N−P+.... regions. Preferably, the N− regions 15 are at least 100 times wider than either the N+ regions 15' or the P+ regions 12. In the absence of a magnetic field, most of the current flows in the relatively wide N− region. Typically, 70% flows in the N− regions 15, with 20% in the thin N+ regions 15' and 10% in the P+ regions 12. With H directed downwards, the charge current in the N− regions 15 will be diverted toward the N+ regions 15' and away from the P+ region 12 thereby leading to a decrease in resistance due primarily to less recombination loss at the N−: P+ boundary.

Conversely, by directing H upward, both electron and hole carriers will be deflected toward the P+ region, and the resistance increases markedly due to greater recombination losses at the N− : P+ boundary. For a discussion of such effects on exposed surfaces, see pages 71–75 and 318–328 of "Electrons and Holes in Semiconductors" by W. Shockley. The "multiple stripe" structures discussed above differ from those treated by Shockley in that the recombination "surfaces" of the "multistripe" devices are internal to the structure, thereby providing greater stability under various ambient conditions. Also, the "multistripe" arrangement allows device having a lower impedance to be fabricated within a given geometrical volume than before possible with conventional single bar configurations.

The top and bottom surfaces of these "parallel striped" devices can advantageously be passivated by thermal oxide growth, or a deposited oxide, nitride, or other dielectric material if desired.

Furthermore, the structure as embodied in FIG. 27 provides an effective magneto-photoconductor when modulated by a light beam having energy greater than the forbidden bandgap width of silicon. A typical light is that which is emitted from a gallium arsenide diode, and the presence of an H-field decreases the photoconductance significantly.

SIXTH EMBODIMENT — STACKED TUNNEL DIODE

Figure 28:
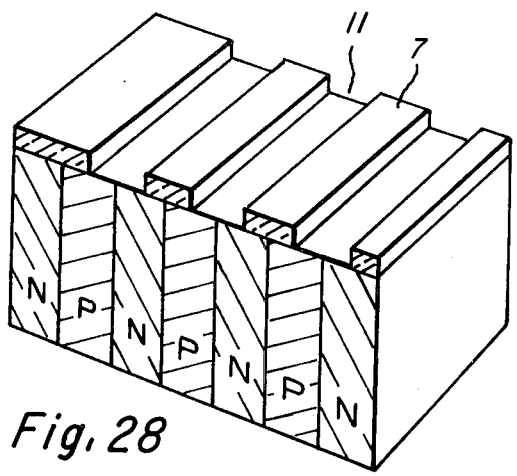
FIGS. 28–31 illustrate various steps in the formation of another embodiment of the invention.
Figure 29:
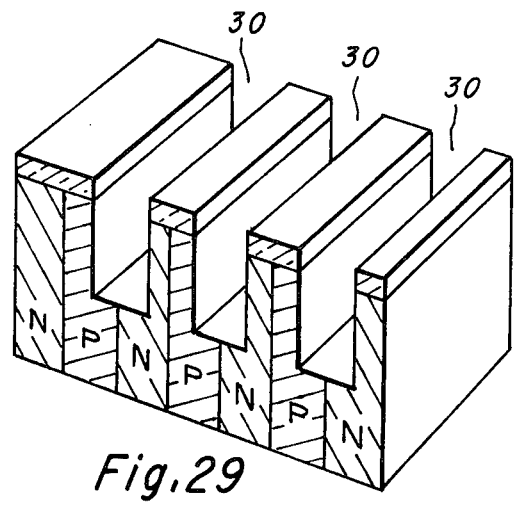
Figure 30:
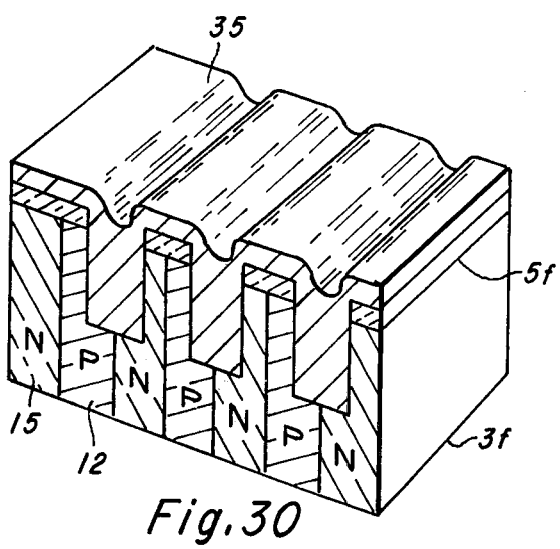

By subsequently masking the structure of FIG. 15 with an oxide layer 7, as shown in FIG. 28, such that parallel apertures therein overly alternate P-N junctions (and accordingly are parallel to the (111) plane intersection with the (110) surface), then a subsequent ODE to a depth of less than 15 mils provides the structure of FIG. 29. Using well-known techniques, metal 35 is deposited, or it is flowed into the grooves 30 with or without removing the second oxide masking layer 7. Sufficient metal is deposited by evaporation and/or other well-known processes to fill the groove 30 completely as shown in FIG. 30. Techniques well-known in the art provide reliable ohmic contacts with the metal 35 to both the P- and N- type regions 12 and 15 respectively.

Figure 18B:
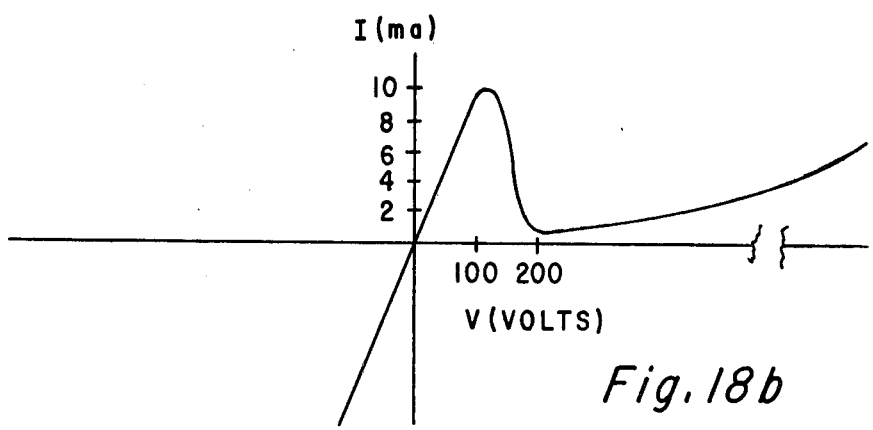
Figure 31:
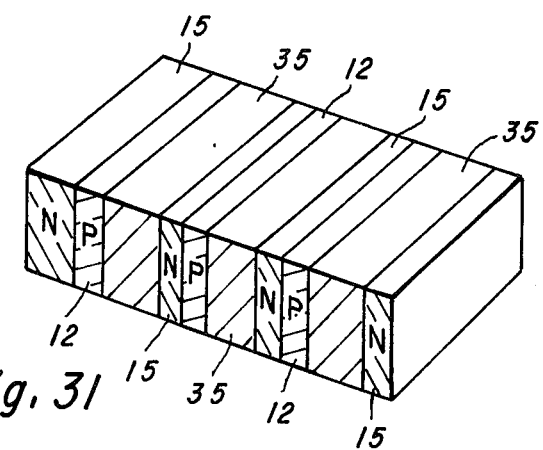

After lapping, grinding, or etching surfaces 5f and 3f to a sufficient depth, the P-N metal structure of FIG. 31 results. Such a structure results in a device exhibiting the tunnel diode electrical characteristic of FIG. 18 a having a proper number of P-N junctions in the stack. However, the electrical characteristics differ from the electrical characteristics depicted in FIG. 18a in that the characteristics are asymmetric. The diodes in the stacks are all either forward or reverse biased for any given bias condition. This is opposed to the preferred operating condition of the structure of FIG. 16, in that a specific biased condition provides both alternate forward and back-biased diodes. Accordingly, when the diode stack illustrated in FIG. 31 is forward biased, the electrical characteristics as illustrated in FIG. 18a for positive voltages are provided, assuming the proper number of junctions in the stack. Conversely, when the diode stack of FIG. 31 is biased in the reverse direction, the device is more conductive than when biased at analogous voltages in the forward bias direction, as illustrted in FIG. 18b. The diode stack of FIG. 31 provides a high voltage rectifier upon the proper choice of conductivities of materials 12 and 15. Typically, substrate 2 is N-type (110) oriented silicon having 3 ohm-cm resistivity. A doping level of $1.8 \times 10^{15}$ atoms/cm$^3$ provides this particular resistivity for the slabs 15. Slabs 12 are heavily doped P-type regions to a concentration exceeding $1 \times 10^{18}$ atoms/cm$^3$. A suitable metal for the slabs 35 is Pb:Sn solder, although other well-known materials such as molybdenum are suitable. The width of the various slabs 12, 15 and 35 are, as earlier noted, further design choices, but typical widths for the high voltage rectifier are 1.0 mil for each region. The preferred mode of operation of the high voltage rectifier is similar to that for the tunnel diode wherein a reverse bias of the diode stack provides the avalanche breakover curve which is characteristic of a reverse biased semiconductor diode having the proper number of junctions as the number in the stack.

Tunnel diodes biased in the negative resistance region are either microwave radiation detectors or emitters.

Similarly, reverse biased avalanche diodes also detect or emit microwave radiation. For a detailed discussion of such devices, see "Microwave Semiconductor Devices and Their Circuit Applications,"edited by H. A. Watson, McGraw Hill, N.Y. 1969. The stacked tunnel diode and stacked rectifier structures discussed herein are advantageously utilized as microwave generators and detectors. The close spacing between junctions featured by this invention provides arrays of microwave detectors and/or generators having very high packing densities and power emission densities and which detect radiation at very low power densities. Also significant are the resonances associated with interrelated spacings of individual junctions in the structures. By providing spacings having magnitude approximate to wavelengths in the microwave region of the electromagnetic spectrum (0.1 to 30 mm) between the junctions, certain related wavelengths are emitted more efficiently than other wavelengths. In particular, junction spacings having integer values of half wavelengths ($\lambda/2$) emit and sense microwaves of wavelength $\lambda$ with particularly high efficiency.

As noted above, one feature of this invention provides fabrication of series and parallel connected diode stacks having smaller spacings between P-N junctions than has heretofore been possible. Conventional photolithography utilized according to the method of this invention provides arrays having junction spacings of 0.2 mils (5 $\mu$m or 0.005 mm). An appropriately biased set of such junctions results in electromagnetic radiation efficiently emitted at 10 $\mu$m, 5 $\mu$m, 3.33 $\mu$m, 2.5 $\mu$m, etc., corresponding to the integers N = 1, 2, 3, 4, . . . Similarly, there is increased radiation emitted at the sub-harmonic wavelengths 20 $\mu$m, 30 $\mu$m, 40 $\mu$m due to the integer half wavelength conditions that exist between alternate P-N junctions. These longer wavelengths are typical of the infrared portion of the spectrum, rather than the traditional microwave spectrum. E-beam exposure (as opposed to light exposure) and such as X-ray exposure provide spacings of the order of a few tenths of a micrometer and accordingly into the visible portion of the spectrum and beyond. The only restriction is that the emitted radiation emerge from the structure without too much absorption of the radiation within the structure.

Series or parallel connected light emitting diodes fabricated from III-V compounds, such as gallium arsenide and gallium arsenide phosphide and gallium aluminum arsenide emit in the infrared and visible spectrum. As mentioned earlier, with regard to the composite resistor, the etched grooves on the (110) plane of the III-V compounds have only one wall substantially perpendicular to the (110) plane. This one wall is quite suitable for forming a P-N junction according to the method of this invention. A reverse bias drives a III-V compound diode into an avalanche condition, as in the diode stack discussed earlier. However, forward biasing of such a diode stack is the preferred operational mode for light emission. The preferred spacings of the junctions are $\lambda_e/2$, $2\lambda_e/2$, $3\lambda_e/2$, etc., wherein $\lambda_e$ is in the region of the naturally emitted wavelengths of the light emitting diode.

Similar spacings provide advantageous emissions when the diode stacks are operated as lasers. That is, reflecting surfaces on the left and right hand ends of the structure shown in FIG. 31 are arranged so that stimulated emission selectively occurs out of the ends when the current reaches the threshold level. Similarly, the top and bottom surfaces can be used as the reflecting surfaces for the laser array, wherein the laser light is predominantly emitted out the top or botom of the structure. The emitted stripes of light form essentially large area laser beams.

MULTI-CONDUCTIVITY SUBSTRATE EMBODIMENT

Figure 32:
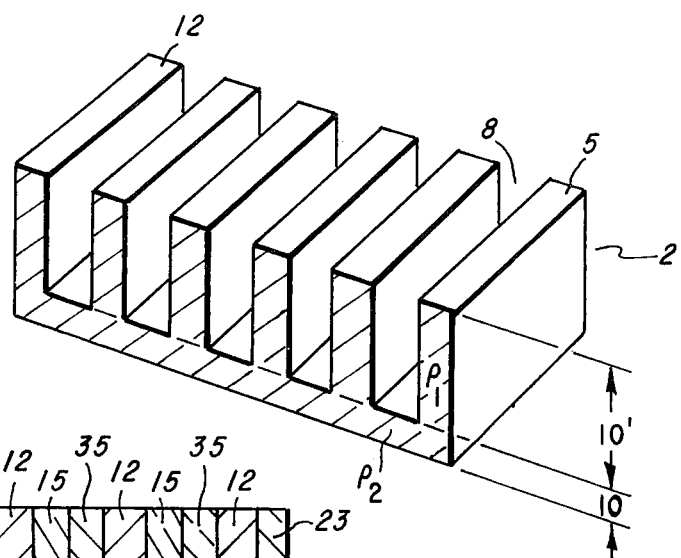
FIGS. 32, 33a–33c depict variations of the above depicted embodiments utilizing a multi-conductivity substrate.
Figure 33A:
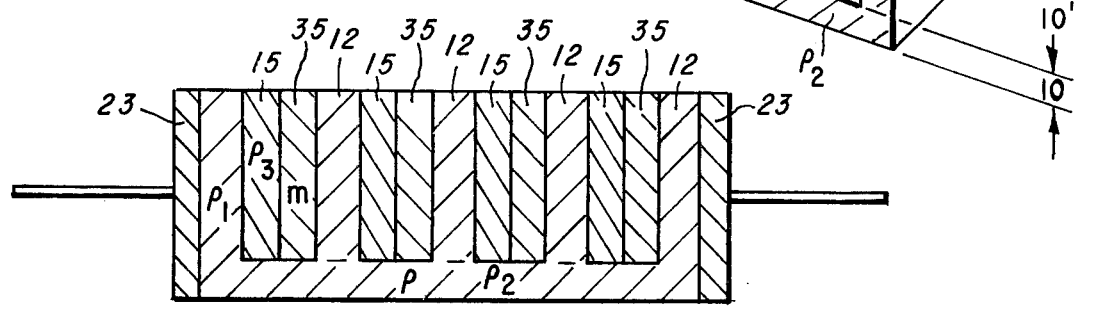
Figure 33B:
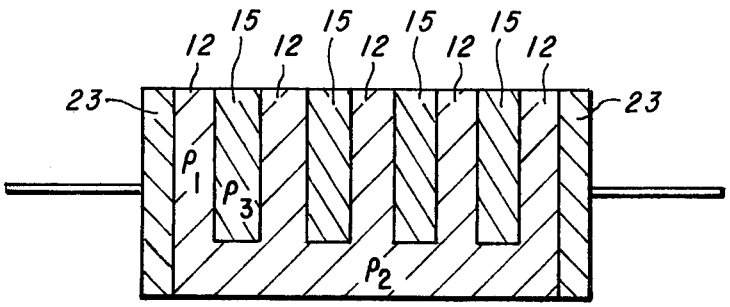
Figure 33C:
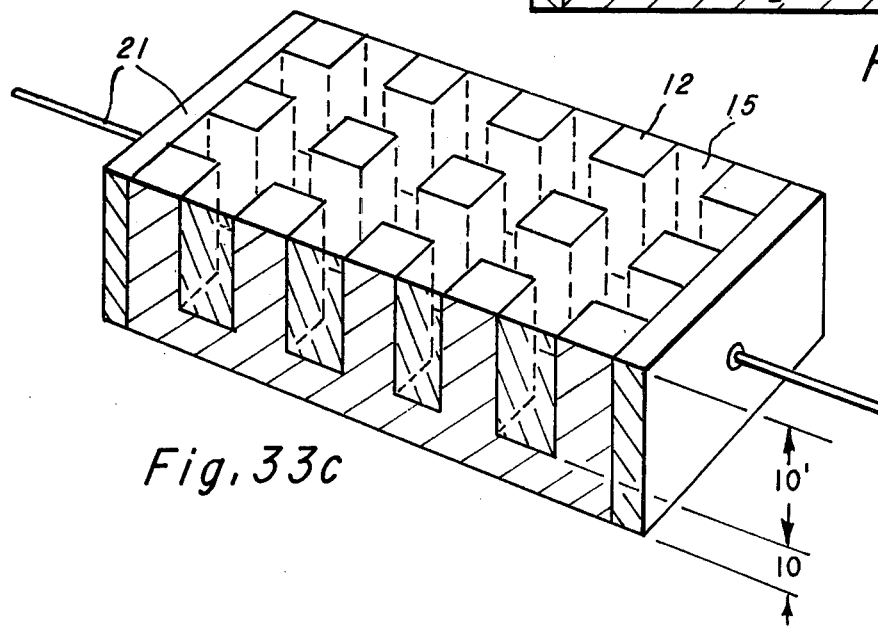

FIG. 32 depicts a semiconductor substrate 2 having at least two layers of different conductivities. Regions 10' between the grooves 8 formed by orientation dependent etching as earlier described have conductivity $\rho_1$ and type in accordance with that described for the plurality of embodiments earlier disclosed. Region 10 underlying the grooves exhibits minimum conductivity $\rho_2$ opposite the type which typically provides electrical isolation therebetween rows 12 of monocrystalline semiconductor. Utilizing such a substrate to provide electrical isolation advantageously allows only one lapping step to remove undesirous conductor between rows 12; whereas utilizing a mono-conductive substrate requires lapping, both above and below the grooves as earlier described. FIGS. 33a – 33b depict . . . $\rho_1 \rho_3$ metal $\rho_1 \rho_3$ metal . . . , . . . $\rho_1 \rho_3/\rho_1 \rho_3$ . . . stacks similar to those earlier described, wherein $\rho_1$ and $\rho_2$ are conductivities of the appropriate type. FIG. 33c depicts the composite resistor characterized by FIG. 25 with $\rho_3$ of FIG. 33c equal to $\rho_2$ of FIG. 25 and $\rho_2$ of FIG. 33c exhibiting minimum conductivity to provide electrical isolation.

Heretofore, all grooves formed in the (110) oriented semiconductor substrate have had all sidewalls substantially perpendicular to the (110) plane. The scope of this invention is understood to include grooves slightly V-shaped in (110) material having upper openings slightly larger than the bottoms of the grooves. This slight V-shape may provide processing advantages by facilitating refill of the grooves during formation of the semiconductor material earlier denoted by numeral 15, when the grooves extend deeply into the substrate. Such slightly V-shaped grooves are provided utilizing a 20%–80% potassium hydroxide/water etchant instead of the earlier mentioned 50% solution. Also, the slight V-shape is provided by a subsequent etch utilizing any conventional silicon etch (assuming silicon is the substrate semiconductor) which provides non-orientation dependent etched grooves.

Providing devices having near ideal junctions in the same slice of monocrystalline semiconductor and accordingly providing a device having exact lattice orientations renders advantages over "diode stacks" conventionally formed by, for example, sawing and mechanically stacking. It is well-known in the art that diode-stack detectors having exact lattice alignment are most responsive to ion induced X-ray fluorescence and proton channeling. Atomic non-alignment of neighboring diodes is severely detrimental to such applications. Conventional growth of epitaxial layers of alternating types provides layers of limited thicknesses, and accordingly limited I-V characteristics. The method of this invention provides devices having substantially unlimited numbers of junctions of desired thickness.

INTEGRATED CIRCUIT EMBODIMENT

The embodiments of the invention heretofore described have been depicted as discrete electronic semiconductor devices. However, one extremely useful feature of the invention is that the various embodiments lend themselves conveniently to combinations in both monolithic and hybrid integrated circuits. Conventionally, a (100) silicon crystal is used in the manufacture of dielectrically isolated integrated circuits, due to the ease with which V-shaped isolation grooves are etched therein. However, due to the substantially vertical sidewalls of the etched groove in (110) orientation silicon, a substantial packing density improvement is achieved over (100) silicon. In light of the further advantages which (110) oriented silicon offers in the light of applicant's invention, the preferences of (100) orientation silicon may be overshadowed.

As suggested above, conventional integrated circuits may be produced on (110) material as is well-known in the art. Utilizing the scheme of dielectric isolation as exemplified in the above-mentioned copending patent application, IMPROVEMENT IN THE METHODS FOR FORMING CIRCUIT COMPONENTS WITHIN A SUBSTRATE AND SEMICONDUCTOR SUBSTRATE, Ser. No. 788,177, filed Dec. 31, 1968, now abandoned, one or more embodiments of the invention heretofore described may readily be combined with conventional integrated circuit technology.

Figure 34:
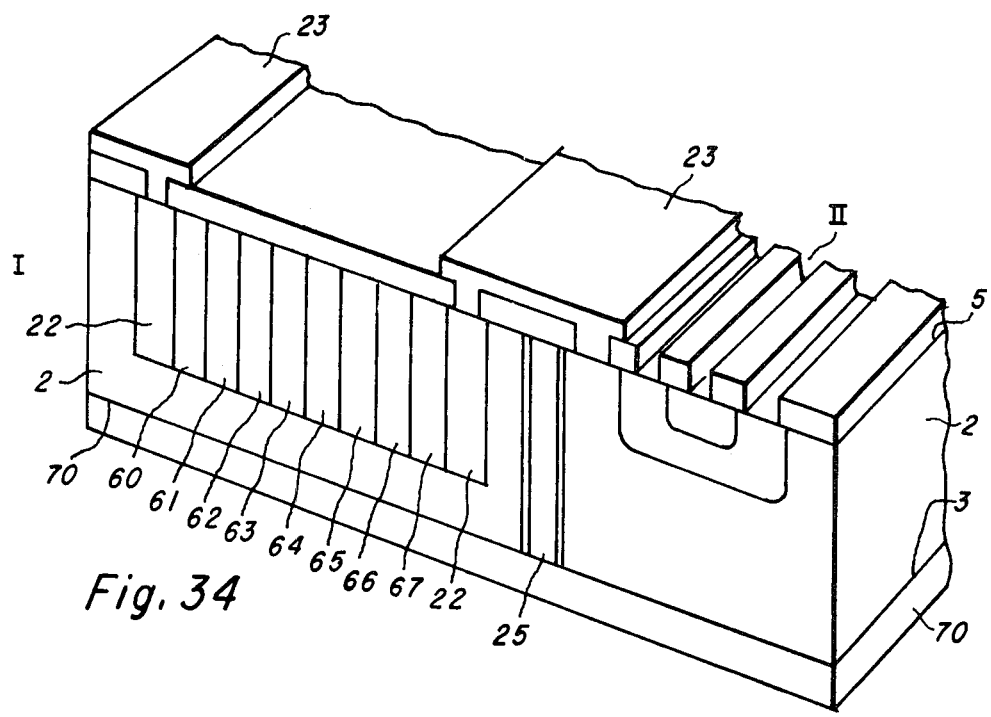
FIGS. 34–35 illustrate embodiments of the invention illustrated in integrated circuit form.

One such combination depicting one of the P-N junction stack embodiments of the invention herein earlier described is illustrated in FIG. 34. A supporting dielectric material 70 underlies silicon substrate 2 having conventional electrical characteristics as commonly encountered in the integrated circuit art. That is, the substrate 2 may have a 20 ohm/cm resistivity and may be N-type. Dielectric isolation region 25 comprises a region of polycrystalline silicon material bounded by oxide regions and extends from the upper surface 5 of the substrate 2 into the dielectric support 70 which underlies lower surface 3. The P-N junction stack is exemplified by the stack comprising regions 60-67. It is understood that regions 60-67 represent any P-N or P-N metal or P-N isolation sequence earlier described in this application to provide the various functions herein described. Contacting the end regions 60 and 67 are electrical terminals 22 which have connected thereto electrical contacts 23 which are interconnected to other elements in the integrated circuit such as transistor II.

Figure 35:
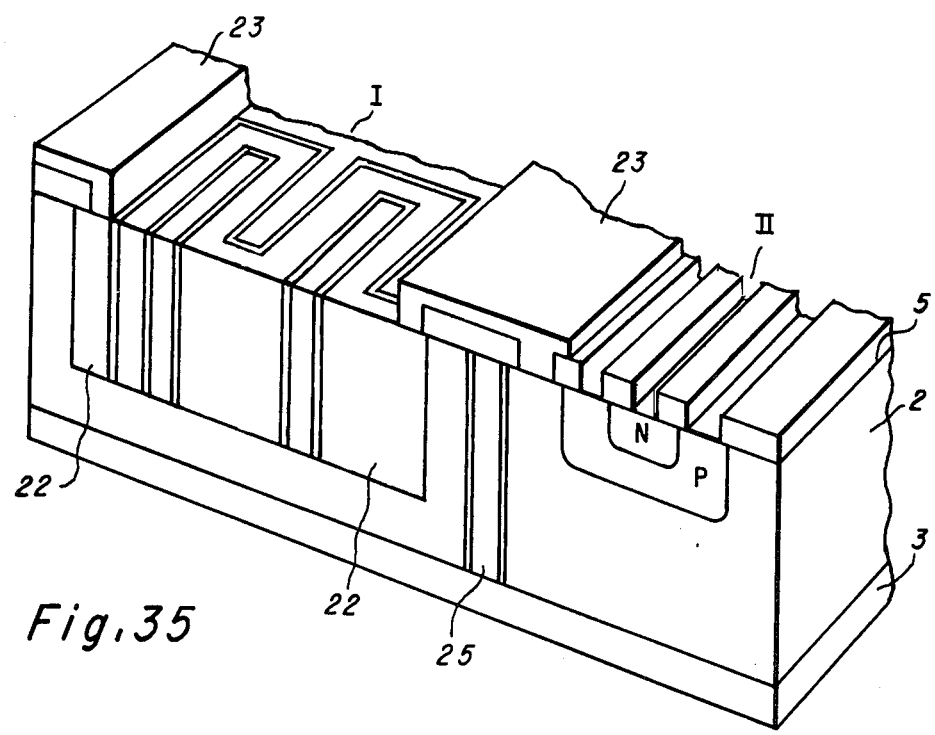

FIG. 35 depicts an integrated circuit form of the first resistor embodiment earlier described in this application. The dielectrically isolated integrated circuit of FIG. 35 has therein the serpentine resistor embodiment I connected to the transistor II by metal interconnects 23. By combining the dielectrically isolated integrated circuit techniques above described with the techniques herein described in providing the embodiments of this invention, the structure of FIG. 35 is readily provided.

It is understood that a plurality of the embodiments herein described may be combined in integrated circuit form, either in monolithic or hybrid form. Furthermore, although depicted in FIG. 35 as dielectrically isolated, diffused isolated integrated circuits may also suitably comprise the invention. Furthermore, other substrates 2 besides silicon may be utilized such as gallium arsenide or germanium.

For additional information on refilling the orientation dependent etched grooves utilizing the embodiments of this invention, reference is directed to copending patent application METHOD OF FORMING CIRCUIT COMPONENTS WITHIN A SUBSTRATE, Ser. No. 435,634, filed Feb. 26, 1965.

Although specific embodiments of this invention have been described herein in conjunction with specific discrete and integrated circuit electronic embodiments having well-defined semiconductor junctions therein, various modifications to the details of structure and of providing such structures will be apparent to those skilled in the art without departing from the scope of the invention.

What is claimed is:

1. A temperature compensated resistor of a semiconductor material having a plurality of conductivities comprising in combination:

N-rows by M-columns of semiconductor mesas of one conductivity and one conductivity type, wherein N and M are integers; and a second semiconductor material of a second conductivity and said first conductivity type interdisposed between and surrounding said means, wherein said one conductivity material and said second conductivity material having temperature coefficients of resistivity of opposite signs over a desired range of temperatures.

2. The semiconductor resistor of claim 1 wherein said first and second semiconductor materials are silicon.

3. The resistor of claim 2 wherein said silicon has a crystal orientation of (110).

4. The semiconductor resistor of claim 1 and further including electrical contacts to opposite sides of said array, each contact electrically contacting said mesas and said interspersed material.

* * * * *